United States Patent
Yu et al.

(10) Patent No.: US 8,222,728 B2
(45) Date of Patent: Jul. 17, 2012

(54) ACTIVE SOLID HEATSINK DEVICE AND FABRICATING METHOD THEREOF

(75) Inventors: Chih-Kuang Yu, Chiayi (TW); Chun-Kai Liu, Taipei (TW); Ming-Ji Dai, Dongshih Township (TW); Chih-Yuan Cheng, Banciao (TW)

(73) Assignee: Industrial Technology Research Institute, Hsinchu (TW)

( * ) Notice: Subject to any disclaimer, the term of this patent is extended or adjusted under 35 U.S.C. 154(b) by 805 days.

(21) Appl. No.: 12/336,320

(22) Filed: Dec. 16, 2008

(65) Prior Publication Data
US 2009/0245308 A1    Oct. 1, 2009

(30) Foreign Application Priority Data
Mar. 28, 2008  (TW) ............................... 97111577 A

(51) Int. Cl.
*H01L 23/10* (2006.01)
*H01L 23/34* (2006.01)
(52) U.S. Cl. ................ 257/706; 438/122; 257/E33.075; 257/E23.101
(58) Field of Classification Search ........... 257/E33.075; 438/122; 372/36
See application file for complete search history.

(56) References Cited

U.S. PATENT DOCUMENTS

| | | | |
|---|---|---|---|
| 6,465,270 B2 * | 10/2002 | Lell | 438/47 |
| 6,552,256 B2 | 4/2003 | Shakouri et al. | |
| 6,790,744 B2 | 9/2004 | Chen et al. | |
| 2001/0050099 A1 | 12/2001 | Shakouri et al. | |
| 2003/0168720 A1 * | 9/2003 | Kamada | 257/666 |
| 2006/0166387 A1 * | 7/2006 | Reznik et al. | 438/22 |

OTHER PUBLICATIONS

Gary L. Solbrekken, et al; Use of Superlattice Thermionic Emission for "Hot Spot" Reduction in a Convectively-cooled Chip; 2004 Inter Society Conference on Thermal Phenomena pp. 610-616, Jun. 1-4, 2004.
097111577, Dec. 26, 2011, Taiwan Search Report.

* cited by examiner

*Primary Examiner* — Long Tran
*Assistant Examiner* — Shaka Scarlett
(74) *Attorney, Agent, or Firm* — Workman Nydegger

(57) ABSTRACT

An active solid heatsink device and fabricating method thereof is related to a high-effective solid cooling device, where heat generated by a heat source with a small area and a high heat-generating density diffuses to a whole substrate using a heat conduction characteristic of hot electrons of a thermionic (TI) structure, and the thermionic (TI) structure and a thermo-electric (TE) structure share the substrate where the heat diffuses to. Further, the shared substrate serves as a cold end of the TE structure, and the heat diffusing to the shared substrate is pumped to another substrate of the TE structure serving as a hot end of the TE structure.

29 Claims, 24 Drawing Sheets

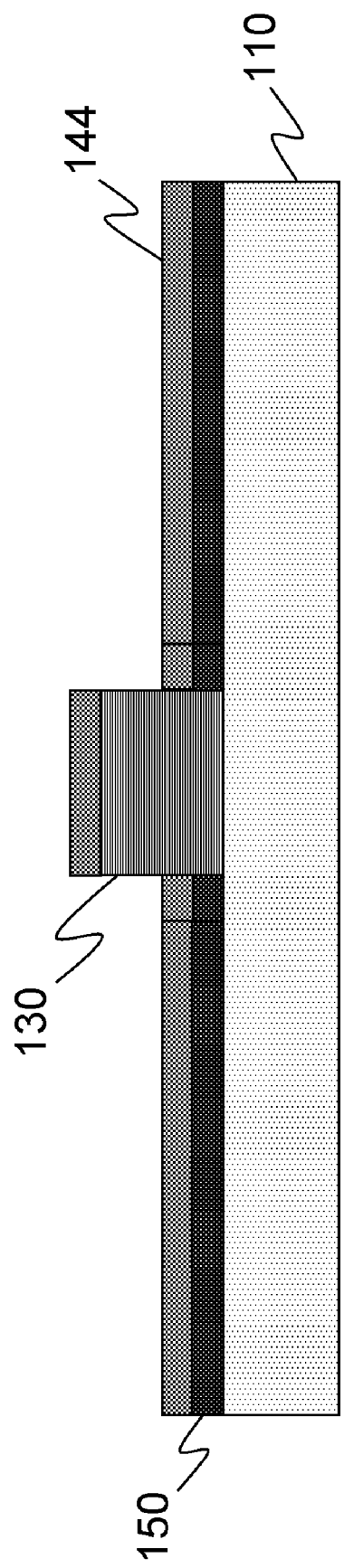
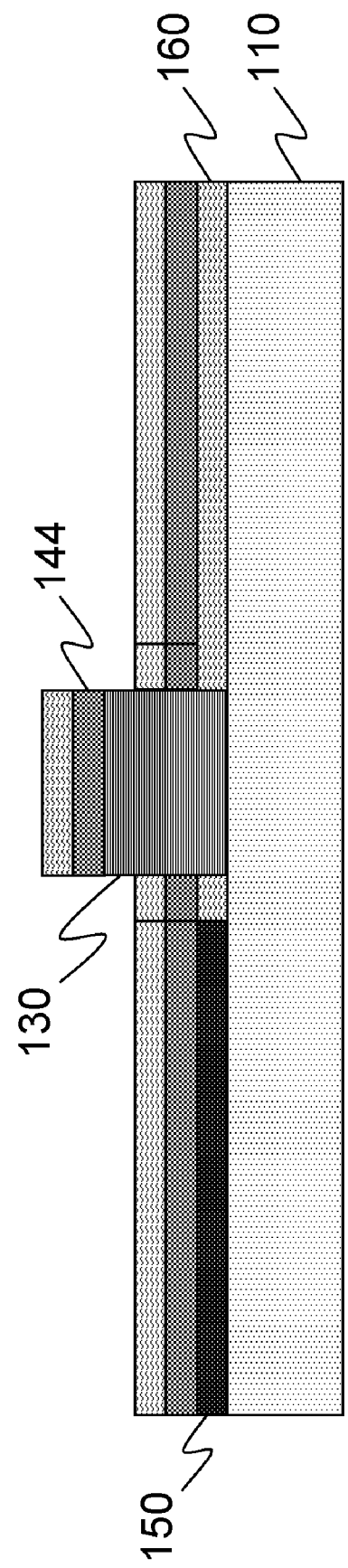

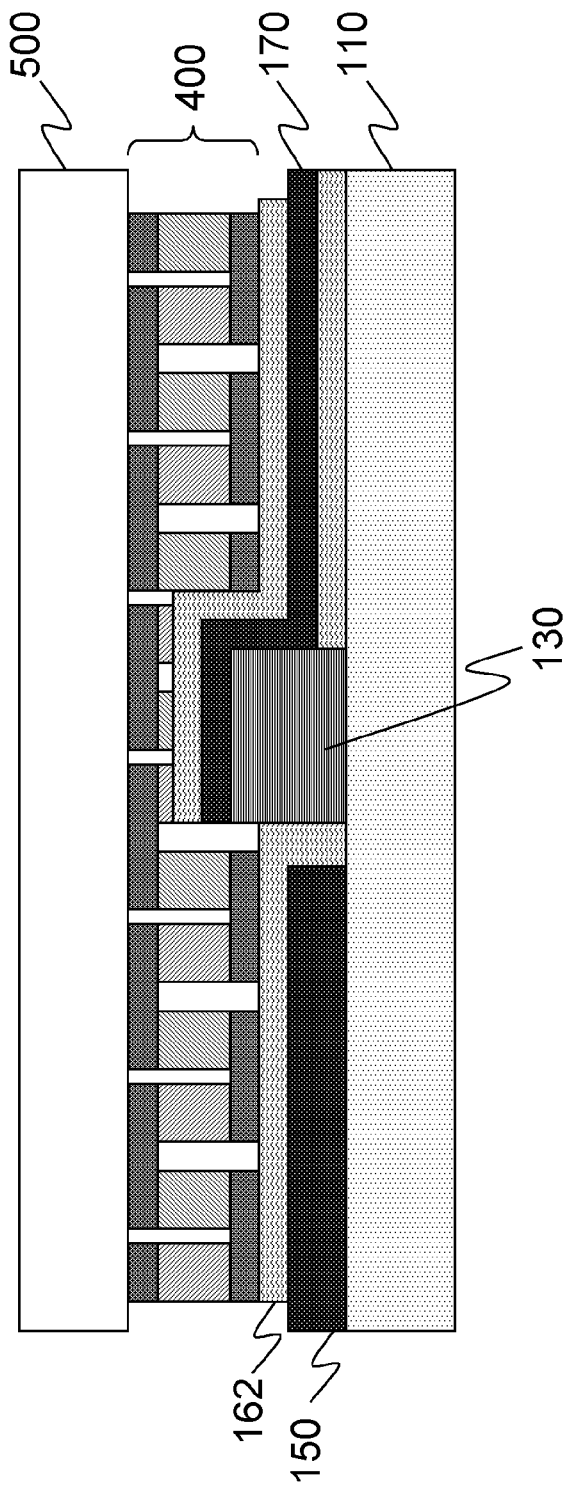
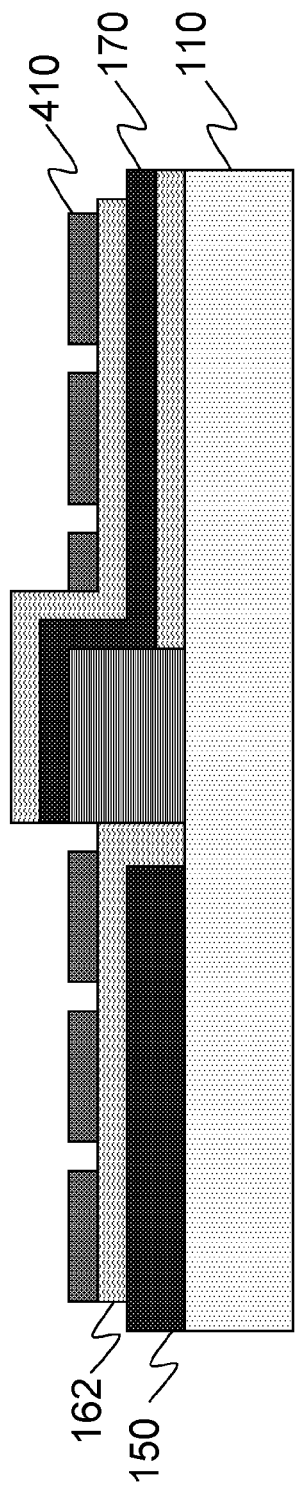
FIG. 18
FIG. 19

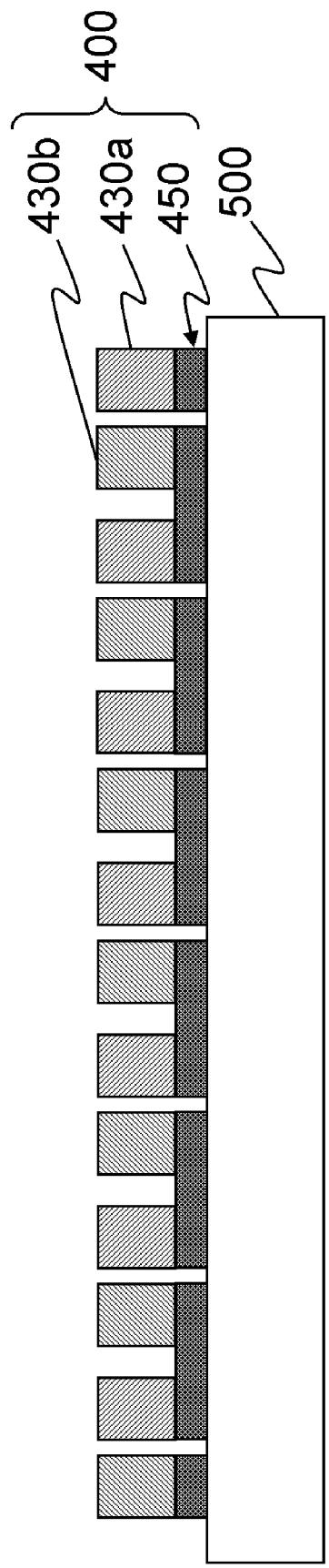
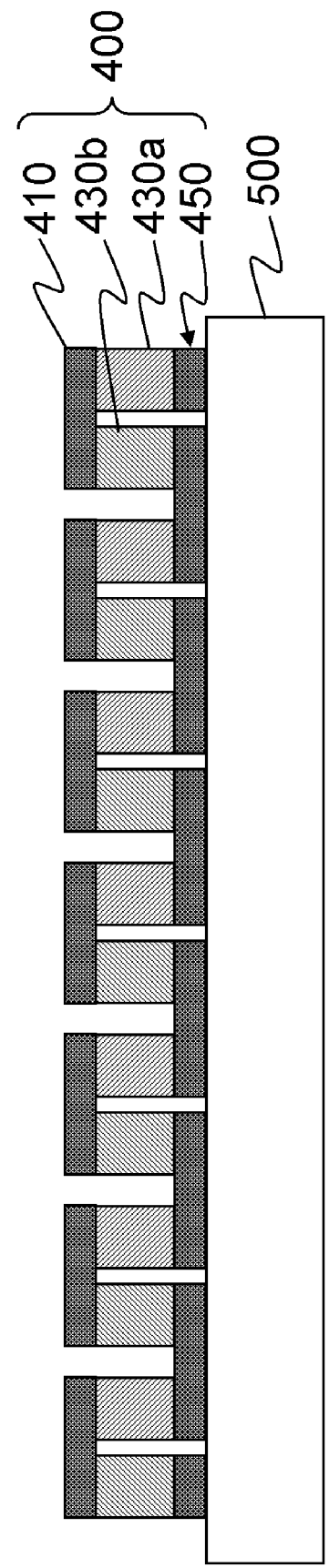

ACTIVE SOLID HEATSINK DEVICE AND FABRICATING METHOD THEREOF

CROSS-REFERENCE TO RELATED APPLICATIONS

This non-provisional application claims priority under 35 U.S.C. §119(a) on Patent Application No(s). 097111577 filed in Taiwan, R.O.C. on Mar. 28, 2008 the entire contents of which are hereby incorporated by reference.

BACKGROUND

1. Field of Invention

The present invention relates to a heatsink device, and more particularly to an active solid heatsink device and fabricating method thereof.

2. Related Art

When an electron industry process is improved from 90 nm to 65 nm or even 45 nm, the heat generation of a developed "multi-core" integrated circuit (IC) has been reduced from 130 W (watt) to 80 W. In this manner, although the high heat generation problem has been solved, the problem of hot spots occurs on an IC chip. A so-called hot spot is a local heat-generating portion with an area of approximately 50 µm (micrometer)*50 µm. On the hot spots, a local heat flux can be up to 150 W/cm$^2$ to 1000 W/cm$^2$. At the same time, the generation of the hot spots will lower the performance of the IC chip (e.g. a processor). Although a conventional heatsink device (e.g. air cooled type or air cooled type used in conjunction with the heat pipes) can settle down the problem of the total heat generation of the processor, the hot spots cannot be effectively eliminated. Therefore, there is a need for a new cooling technique capable of eliminating the problem of the hot spots.

On the other hand, on the application of the light emit diodes (LEDs), the improvement of the light-emitting brightness of the LEDs will increase the heat generation amount per unit unit area of the LEDs, and thus a heat-generating density is continuously increased. At the same time, since the package structure of the LEDs is different from that of common ICs, the heat dissipation manner of the LEDs is also different of that of the common ICs. Therefore, the heat dissipation problem of the LEDs is also a technical bottleneck to be solved by the photoelectric semiconductor industry. Currently, mostly solder ball bumps or bonding pads are used as the heatsink bodies for transferring the heat to the heatsink device fin or the substrate in a heat conduction manner, so as to dissipate the heat. Although the similar passive heat dissipation methods are integrated in the package structure of the LEDs, for providing the heat dissipating capability, the heatsink bodies transfer the heat from a hotter heat source to a colder heatsink device component based on a basic law of thermodynamics, and then the heatsink components exchanges the extra heat through the heat conduction and heat convection. Thus, the heat dissipation effect is poor. Then, a solid active heatsink device is developed to provide more direct and efficient cooling capability.

A conventional active solid heatsink device is a thermoelectric (TE) element. The TE element is also called a refrigerator, which is an active cooling technique and has the effect of reducing the temperature to below the room temperature. The TE element uses a carrier of the semiconductor as a heat conduction medium, and the energy required by the electron to flow is provided by an externally applied direct current (DC). Thus, the carrier flows from a cold end to a hot end, thereby transferring the heat from one end to the other end and achieving the heat dissipation effect. In other words, when the TE element is powered, the electrons start from a negative electrode, pass through a P-type semiconductor channel and absorb the heat energy therein, then reach an N-type semiconductor channel and release the heat energy. Here, once passing through one P-N module, the heat energy is transferred from one end to the other end. In this manner, the heat energy is actively pumped to cause the temperature difference, thereby forming the cold and hot ends. The TE element can be used to control the temperature, and the structure thereof is simple. Therefore, the refrigerant is not required, and mechanical parts are omitted, thus eliminating noises.

Another active solid heatsink device is a thermionic (TI) element. An operating principle of the TI element is similar to that of the TE element. The TI element includes two spaced metal electrodes. By applying a potential difference between the two metal electrodes, the electron flow is driven to flow from one electrode to the other electrode. At the same time, as the energy is transferred, i.e. the electrode where the net electrode flow origins becomes cool, and the electrode where the net electrode flow terminates becomes hot. Due to the physical limitations, the conventional TI element cannot achieve the cooling requirements under the normal temperature. Therefore, the semiconductor material is used as the medium between the electrodes, so as to improve the net electron flow (conductivity) of the TI element. By using the heterogeneous structure semiconductor (e.g. super lattice semiconductor material) as the medium, the conductivity of the TI element can be improved, and meanwhile the heat conduction coefficient of the semiconductor can be reduced, so as to prevent the heat energy of the hot end flowing back to the cold end due to the temperature difference, thereby improving the efficiency of the TI element.

However, in the conventional active solid heatsink device, a single pin area is larger than or equal to the area of the hot spot, and the high heat-generating density of the hot spot exceeds a heat load of a single pin. Therefore, the effect of merely using the active solid heatsink device for eliminating the hot spots is quite limited.

SUMMARY OF THE INVENTION

The present invention provides an active solid heatsink device, which includes a heavy doped first substrate, a metal layer, a semiconductor film block, and a second electrode.

The metal layer and the semiconductor film block are located on the same surface of the first substrate and are spaced from each other. The second electrode is connected to the semiconductor film block, and is spaced from the metal layer and the first substrate. The metal layer has a first electrode. The semiconductor film block cancan be a super lattice barrier.

The present invention provides a method of fabricating an active solid heatsink device, which includes the following steps. A heavy doped first substrate is provided. A semiconductor film block and a metal layer are formed on the same surface of the first substrate. A second electrode connected to the semiconductor film block and spaced from the metal layer and the first substrate is formed. The semiconductor film block and the metal layer are spaced apart, and the metal layer has a first electrode.

When the device operates, a voltage is applied between the first electrode and the second electrode, so as to generate an electron flow flowing from the second electrode to the first electrode via the semiconductor film block and the first substrate, thereby carrying away the heat energy generated by a heat source in contact with the other surface of the first substrate opposite to the semiconductor film block.

An insulating layer can be covered on the other side of the metal layer opposite to the first substrate, so as to serve as a substrate which is shared by the TE structure during subsequent processing. Then, at least one TE element can be formed on the insulating layer, and a second substrate is connected to the other end of the TE element opposite to the insulating layer. In this manner, the heat energy spreading to the insulating layer can be pumped to the second substrate by the TE, so as to further improve the heat dissipation efficiency.

According to the active solid heatsink device and the fabricating method thereof of the present invention, the high-effective solid cooling device provided by the present invention has a wide application field, and can be used for cooling not only the common ICs and LEDs, but also a laser source, a switcher, a router, a detector, and other elements in a large scale integrated circuit (LSI), a processor, or an optical communication system, and even a refrigerator and other household appliance.

BRIEF DESCRIPTION OF THE DRAWINGS

The present invention will become more fully understood from the detailed description given herein below for illustration only, and thus are not limitative of the present invention, and wherein:

FIG. 3 is a top view of a structure as shown in FIG. 1B, in which FIG. 1B is a schematic cross-sectional view taken along a section line I-I;

FIG. 4 is a top view of a structure as shown in FIG. 1C, in which FIG. 1C is a schematic cross-sectional view taken along the section line I-I;

FIG. 6 is a top view of a structure as shown in FIG. 5C, in which FIG. 5C is a schematic cross-sectional view taken along the section line I-I;

FIG. 10 is a top view of a structure as shown in FIG. 9A, in which FIG. 9A is a schematic cross-sectional view taken along the section line I-I;

FIG. 11 is a top view of a structure as shown in FIG. 9B, in which FIG. 9B is a schematic cross-sectional view taken along the section line I-I;

FIG. 12 is a top view of a structure as shown in FIG. 9C, in which FIG. 9C is a schematic cross-sectional view taken along the section line I-I;

FIGS. 13A to 13B are fabrication flow charts of an embodiment of the structure as shown in FIG. 9A;

FIG. 14 is a top view of the structure as shown in FIG. 13A, in which FIG. 13A is a schematic cross-sectional view taken along the section line I-I;

FIG. 18 is a schematic cross-sectional view of an active solid heatsink device according to a third embodiment of the present invention;

FIG. 19 is a schematic cross-sectional view of an active solid heatsink device according to a fourth embodiment of the present invention;

FIG. 21A is a schematic cross-sectional view of a first embodiment of a TE structure in the active solid heatsink device of the present invention;

FIG. 21B is a schematic cross-sectional view of a second embodiment of a TE structure in the active solid heatsink device of the present invention;

DETAILED DESCRIPTION OF THE INVENTION

Figure 1A:
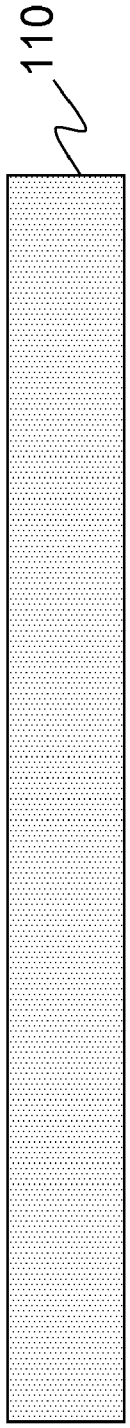
FIGS. 1A to 1C are fabrication flow charts of an active solid heatsink device according to a first embodiment of the present invention.
Figure 1B:
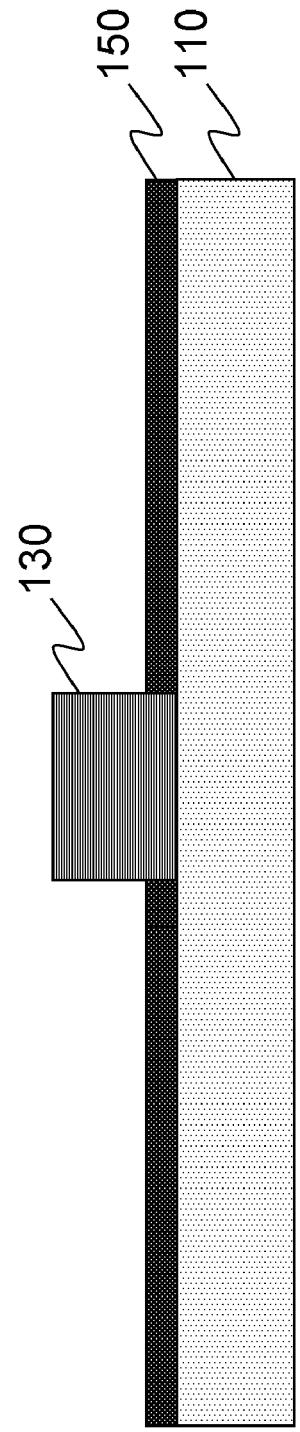
Figure 1C:
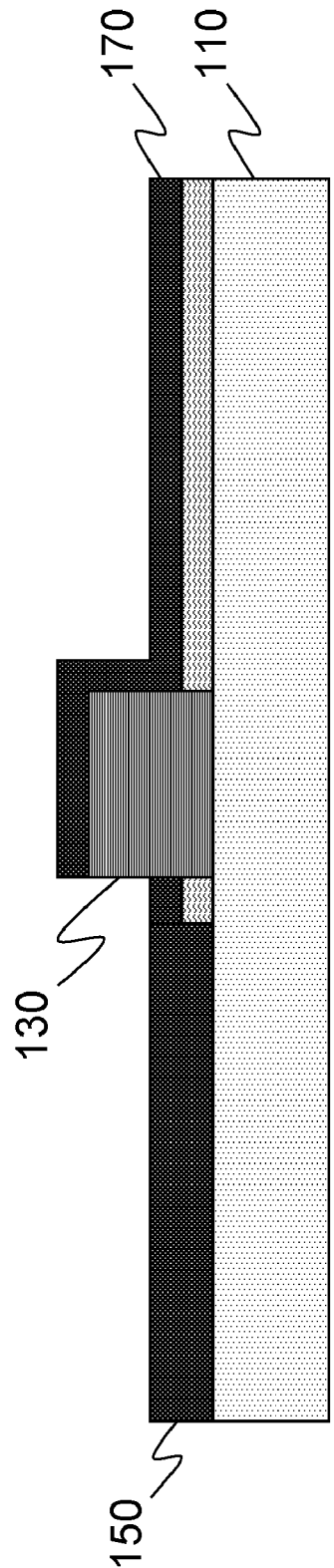

FIGS. 1A to 1C show a method of fabricating an active solid heatsink device according to an embodiment of the present invention.

Figure 2:
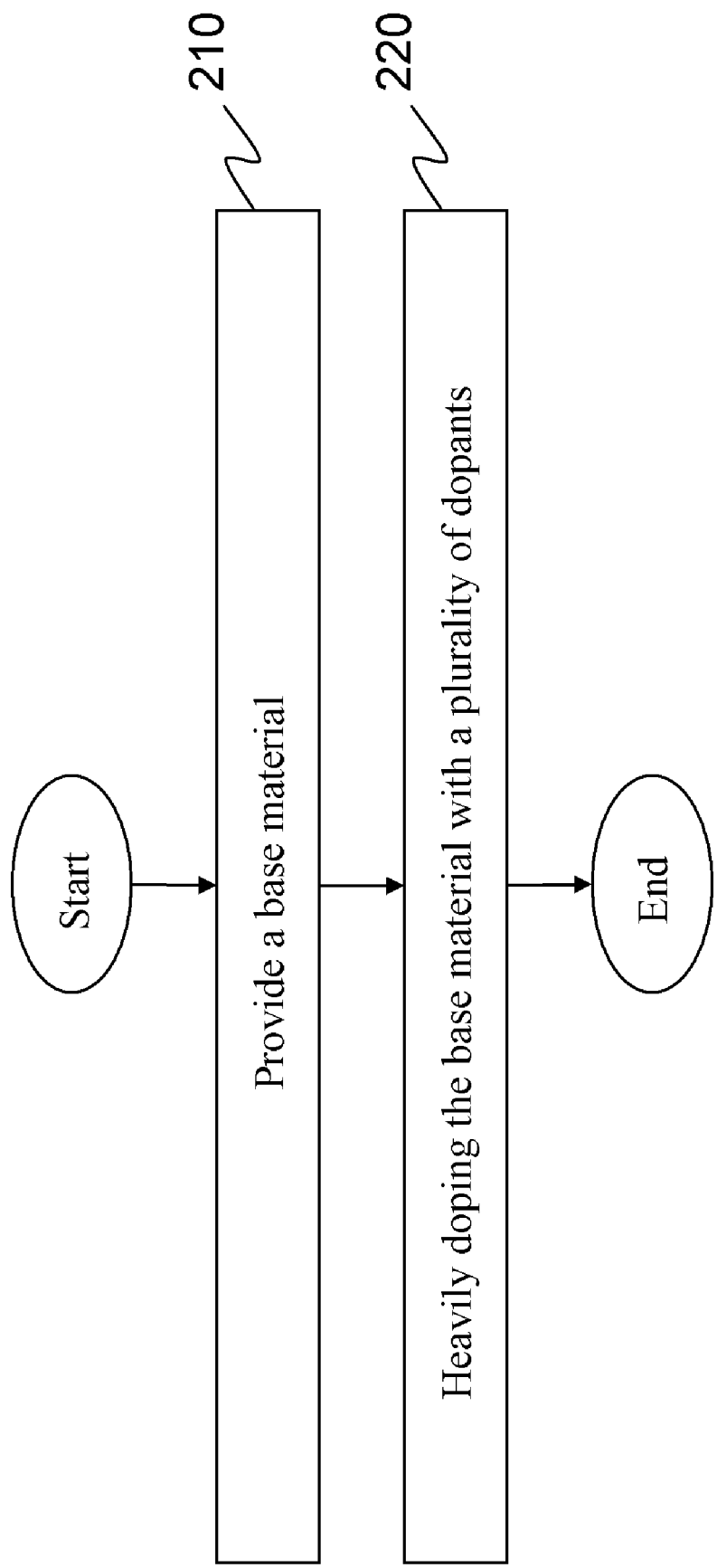
FIG. 2 is a fabrication flow chart of an embodiment of a structure as shown in FIG. 1A.

A heavy doped first substrate 110 is provided, a shown in FIG. 1A. The heavy doped first substrate 110 can be obtained through the following steps. Referring to FIG. 2, first, the base material for fabricating the first substrate 110 is provided (step 210). Then, the base material is heavily doped with a plurality of dopants (step 220), so as to obtain the first substrate 110 as shown in FIG. 1A. For example, the first substrate 110 can be, but not limited to, heavy doped P or N silicon substrate.

Figure 3:
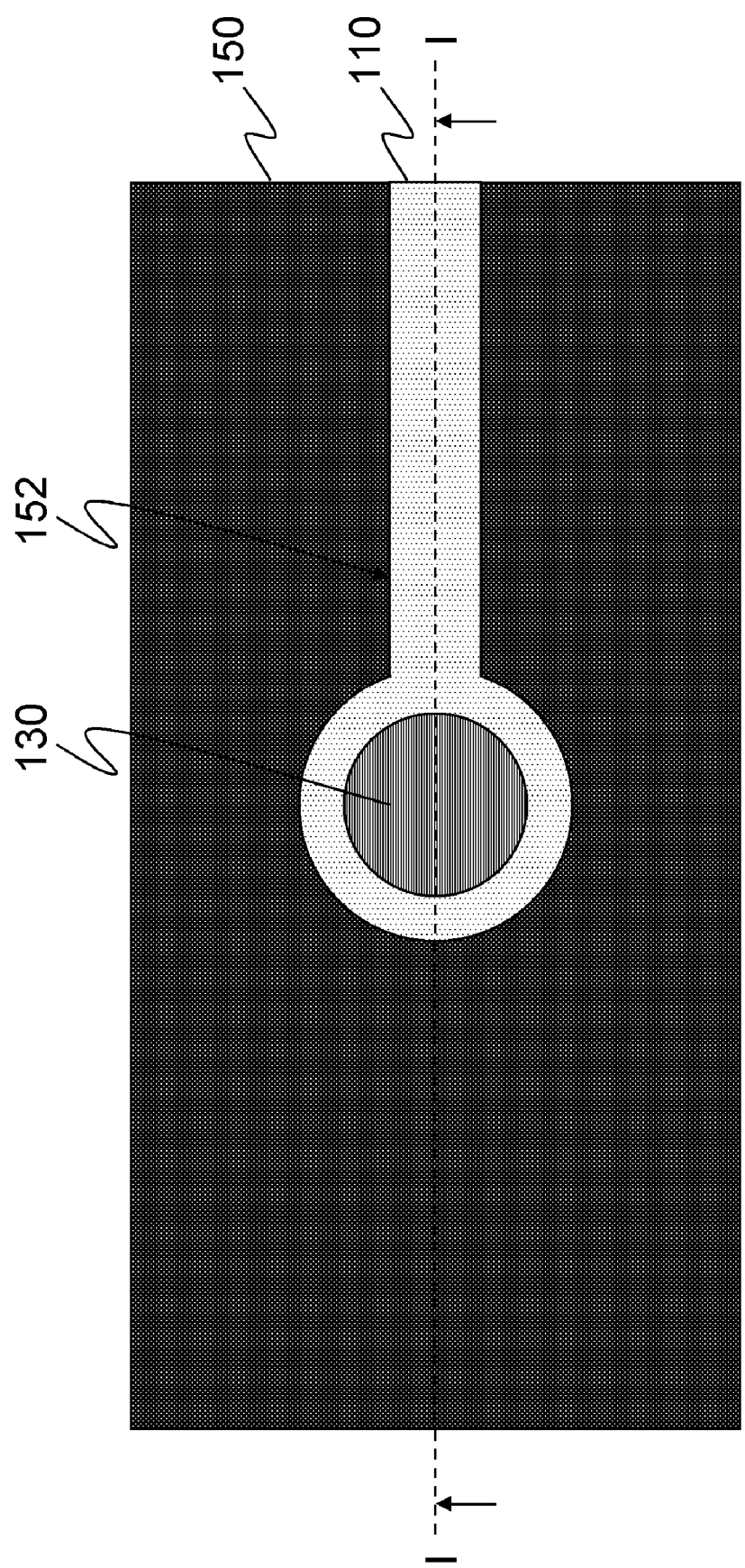

A semiconductor film block (e.g. a super lattice barrier 130 for convenience of illustration) and a metal layer 150 are formed on the same surface of the first substrate 110, as shown in FIGS. 1B and 3. The super lattice barrier 130 and the metal layer 150 are spaced apart. In addition to a column as shown in the figure, the super lattice barrier 130 can be in other three-dimensional geometrical shapes freely, for example, but not limited here, a cube, a hexagonal prism, or a triangular prism, etc. In other words, the super lattice barrier 130 can be replaced by other semiconductor film blocks having the TE characteristics.

Figure 4:
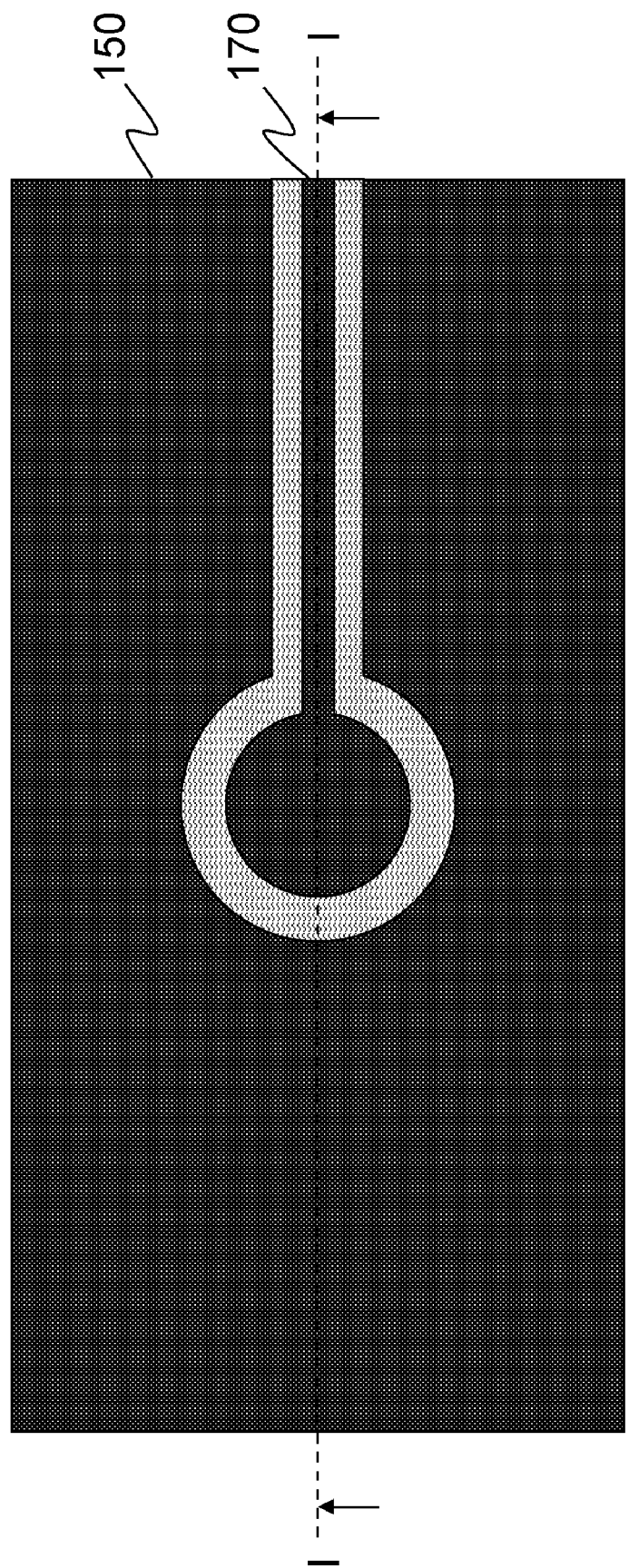

Then, a second electrode 170 connected to the super lattice barrier 130 is formed, and the second electrode 170 is spaced from the metal layer 150 and the first substrate 110. That is to say, the second electrode 170 is not directly connected to, that is, does not contact with, the metal layer 150 and the first substrate 110, as shown in FIGS. 1C and 4. In this manner, a TI structure can be formed. During operation, the other surface of the first substrate 110 opposite to the super lattice barrier 130 contacts the heat source, and a voltage is applied between the metal layer 150 and the second electrode 170. That is to say, the heat energy generated by the heat source is carried away by the electron flow flowing from the second electrode 170 to the metal layer 150 via the supper lattice barrier 130 and the first substrate 110.

Figure 5A:
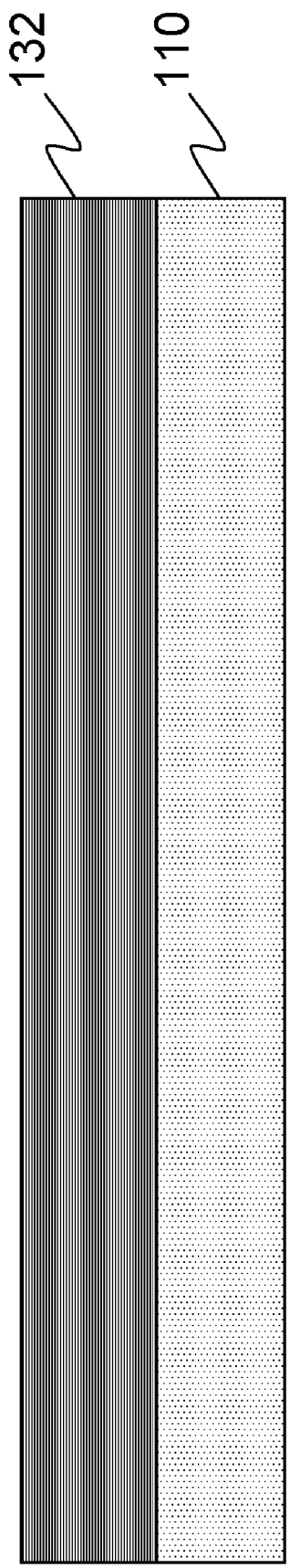
FIGS. 5A to 5D are fabrication flow charts of an embodiment of the structure as shown in FIG. 1B.
Figure 5B:
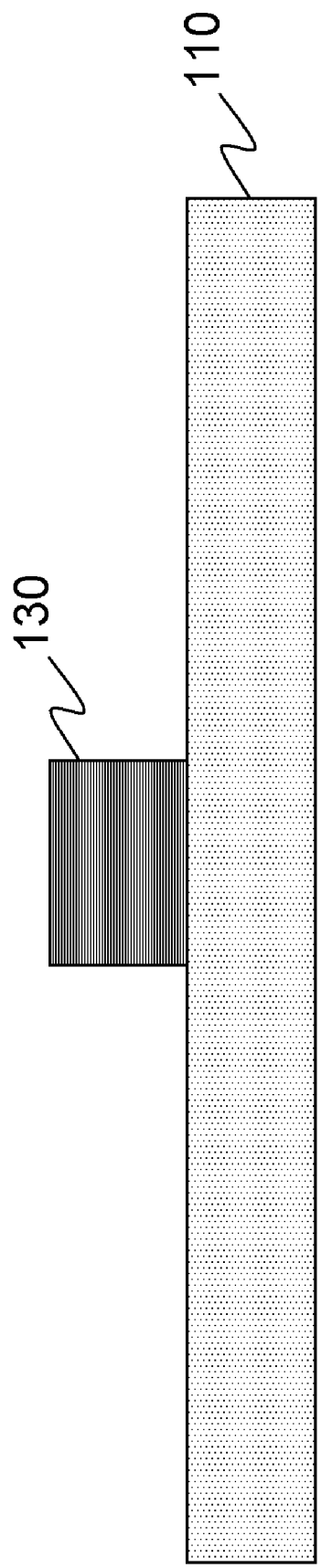
Figure 5C:
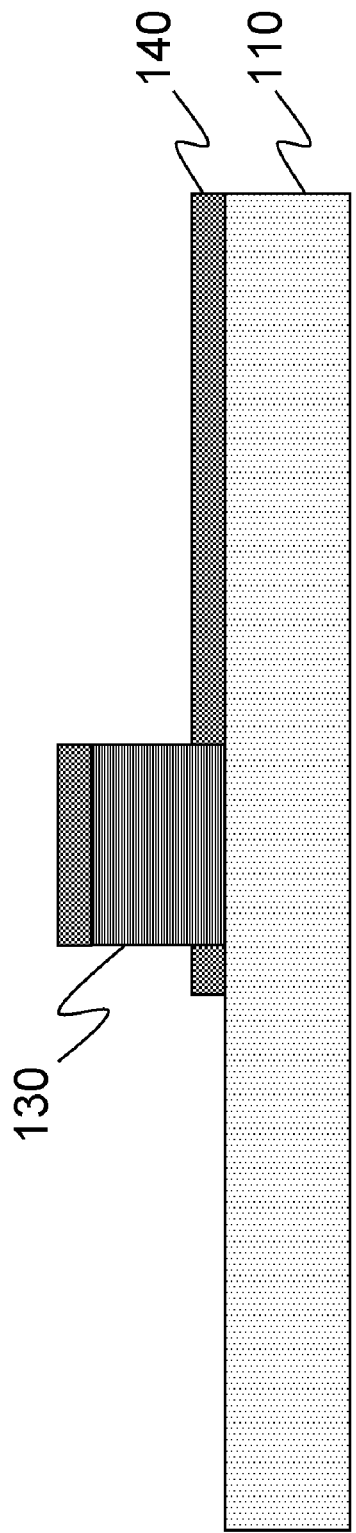
Figure 5D:
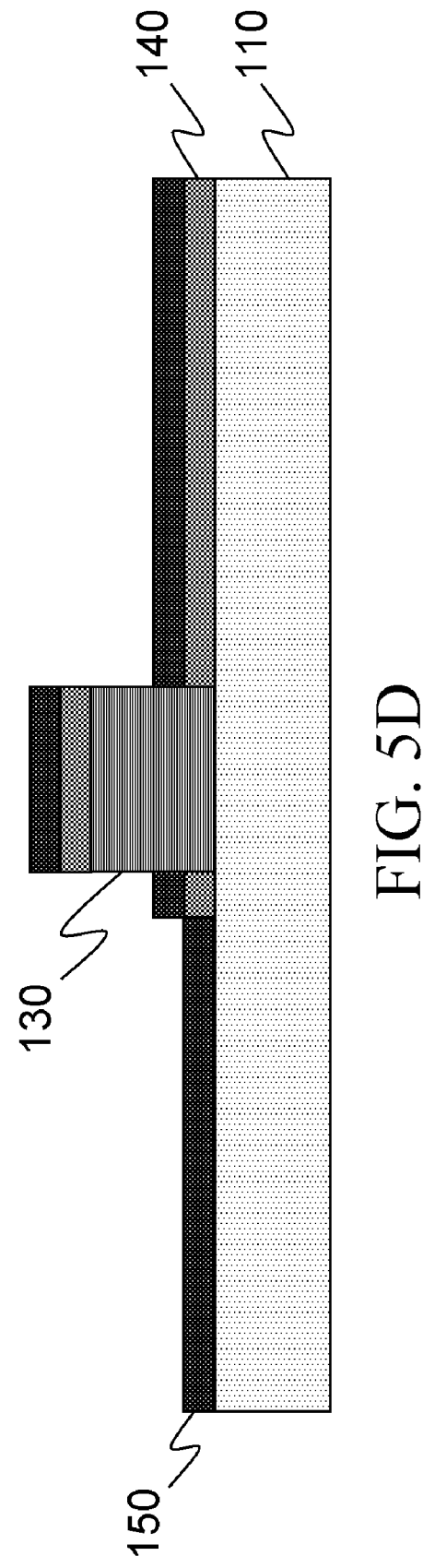
Figure 6:
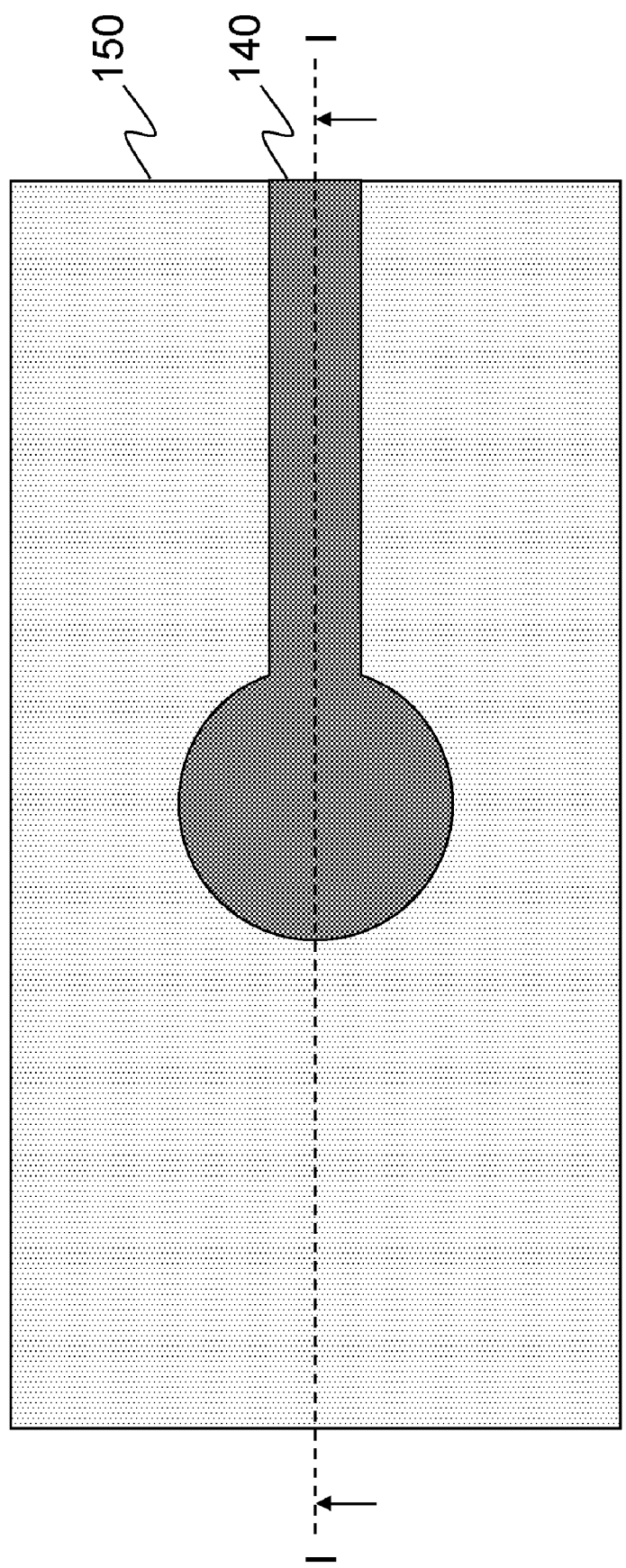

In an embodiment, a super lattice thin layer 132 can be first grown on the surface of the first substrate 110, as shown in FIG. 5A. Then, the undesired portion is removed by etching, laser lift-off, or other semiconductor techniques, so as to form the super lattice barrier 130, as shown in FIG. 5B. A protective layer 140 is formed on the super lattice barrier 130 and the first substrate 110a in the predetermined region around the super lattice barrier 130 (i.e. the region in which the metal layer is not formed) by the semiconductor processing technique, for example, a coating process, as shown in FIGS. 5C and 6. In addition, the protective layer 140 can be formed on a corresponding position on the first substrate 110 corresponding to the position on which the second electrode 170 is to be formed (for example, the protective layer 140 as shown in FIG. 6, extending from the corresponding position on which the super lattice barrier 130 is to be formed to far away). Then, the metal layer 150 is formed on the first substrate 110 and the protective layer 140 by metal sputtering, evaporation, electroplating, or other semiconductor process techniques, as shown in FIG. 5D. Finally, the protective layer 140 is removed together with the metal layer 150 on the protective layer 140, so as to obtain the metal layer 150 spaced from the super lattice barrier 130 through a notch, i.e. the structure as shown in FIGS. 1B and 3.

Figure 7:
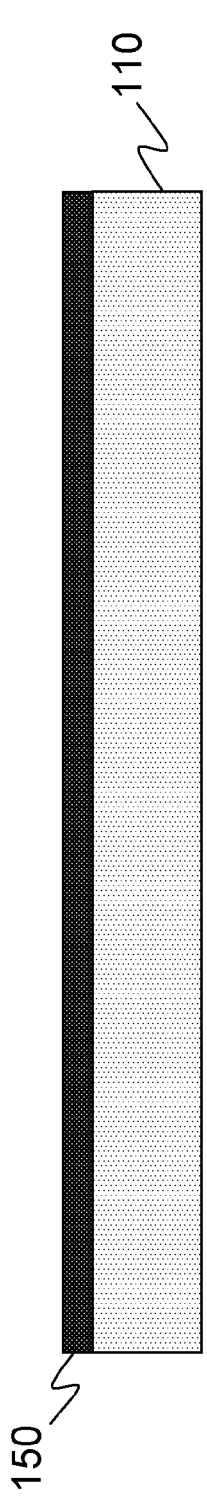
FIGS. 7 to 8 are fabrication flow charts of another embodiment of the structure as shown in FIG. 1B.
Figure 8:
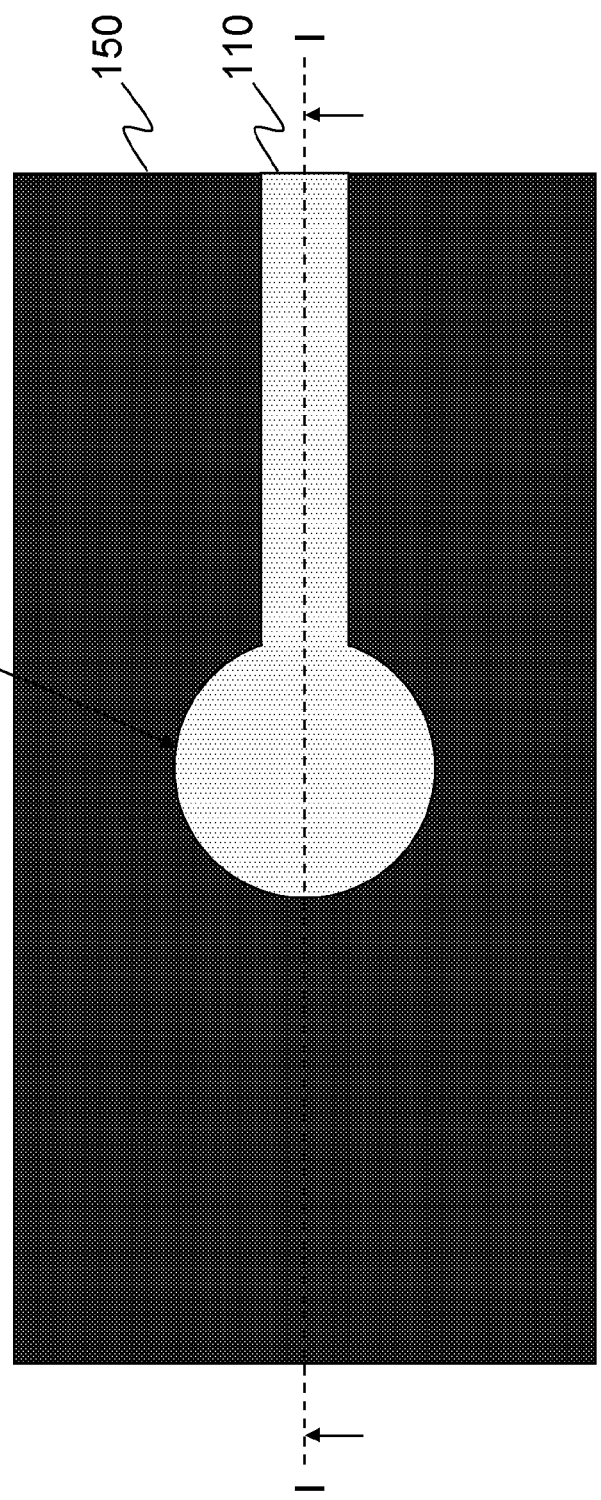

In another embodiment, a whole metal layer 150 can be first grown on the surface of the first substrate 110, as shown in FIG. 7. Then, a notch 152 exposing the first substrate 110 is etched on the metal layer 150 through an etching process, as shown in FIG. 8. Then, the super lattice barrier 130 is disposed on the surface of the first substrate 110 in the notch 152, so as to obtain the structure as shown in FIGS. 1B and 3. Here, the notch 152 can be formed corresponding to the position on which the super lattice barrier 130 is to be formed, such that when the super lattice barrier 130 is disposed in the notch 152, the super lattice barrier 130 and the metal layer 150 can be spaced apart. In addition, the notch 152 can be formed corresponding to the position on which the second electrode 170 is to be formed. Therefore, when the second electrode 170 is formed, the second electrode 170 can not be directly connected to the metal layer 150. In other words, the second electrode can be formed corresponding to the position of the notch.

Figure 9A:
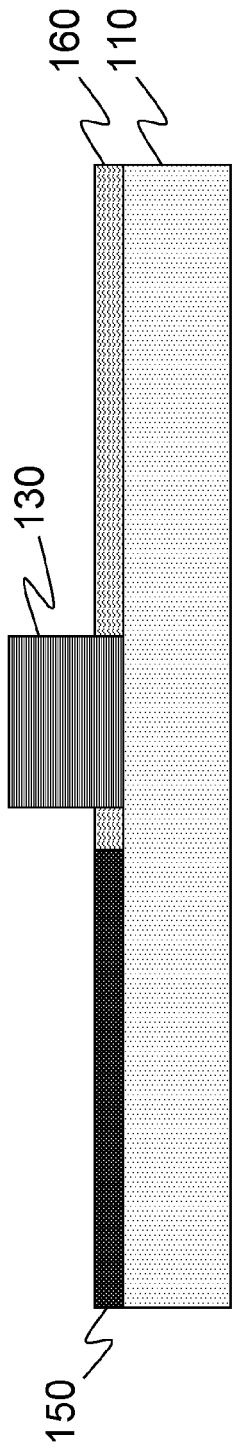
FIGS. 9A to 9C are fabrication flow charts of an embodiment of the structure as shown in FIG. 1C.
Figure 9B:
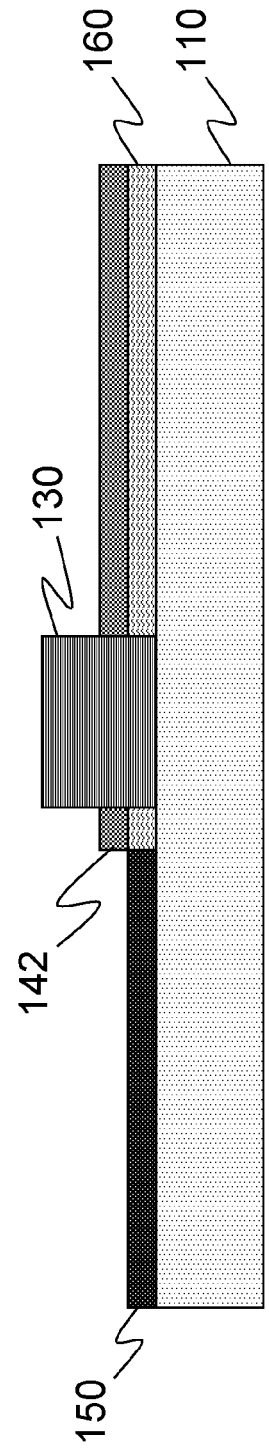
Figure 9C:
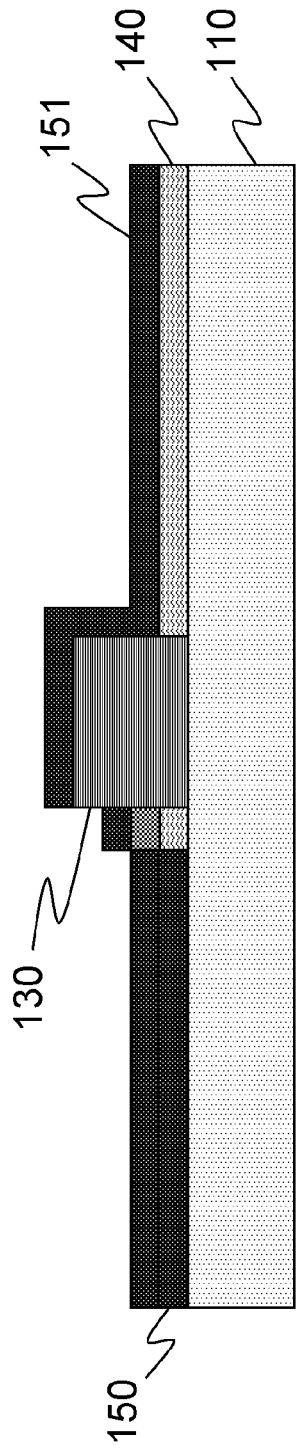
Figure 10:
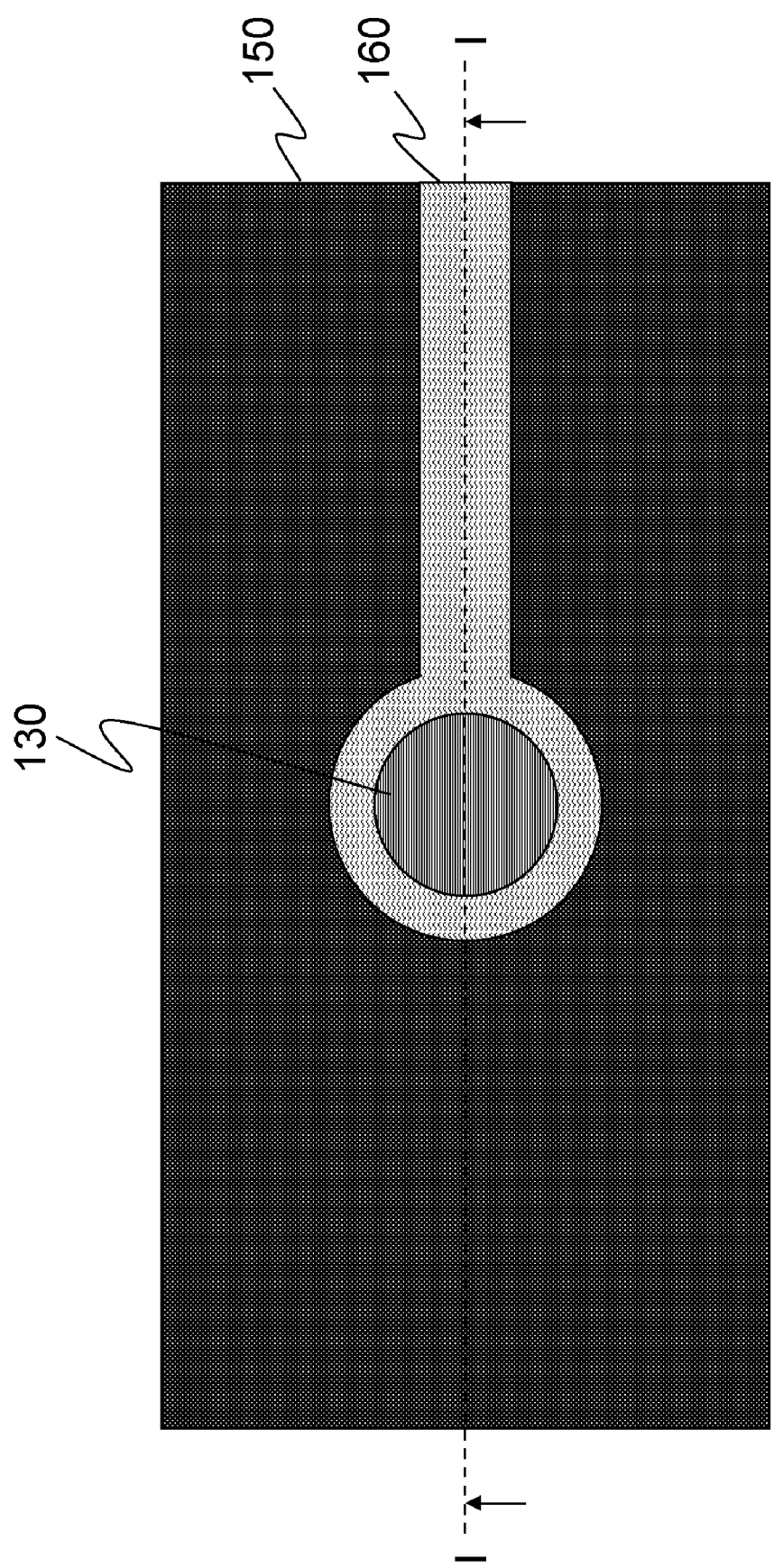
Figure 11:
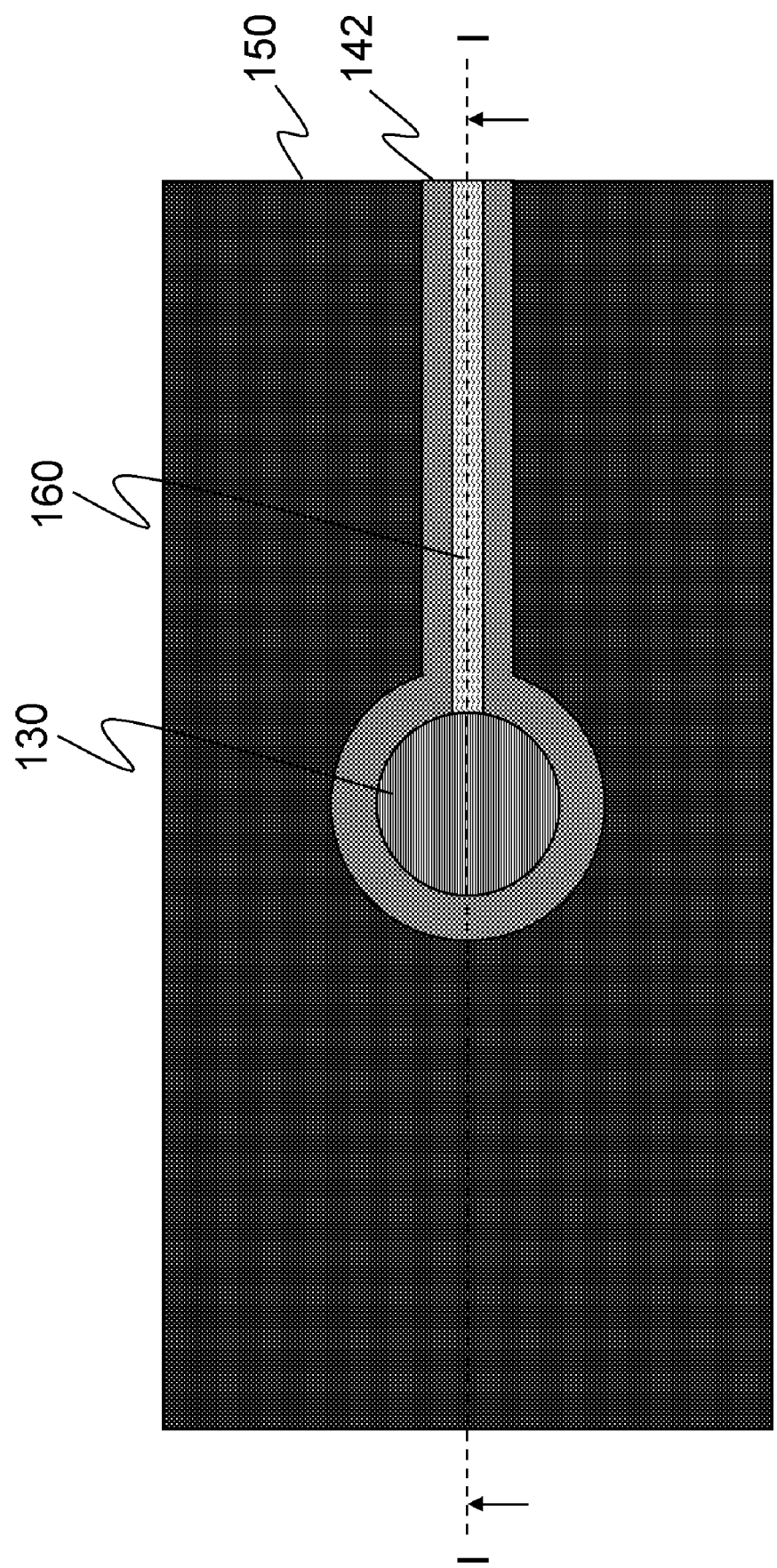
Figure 12:
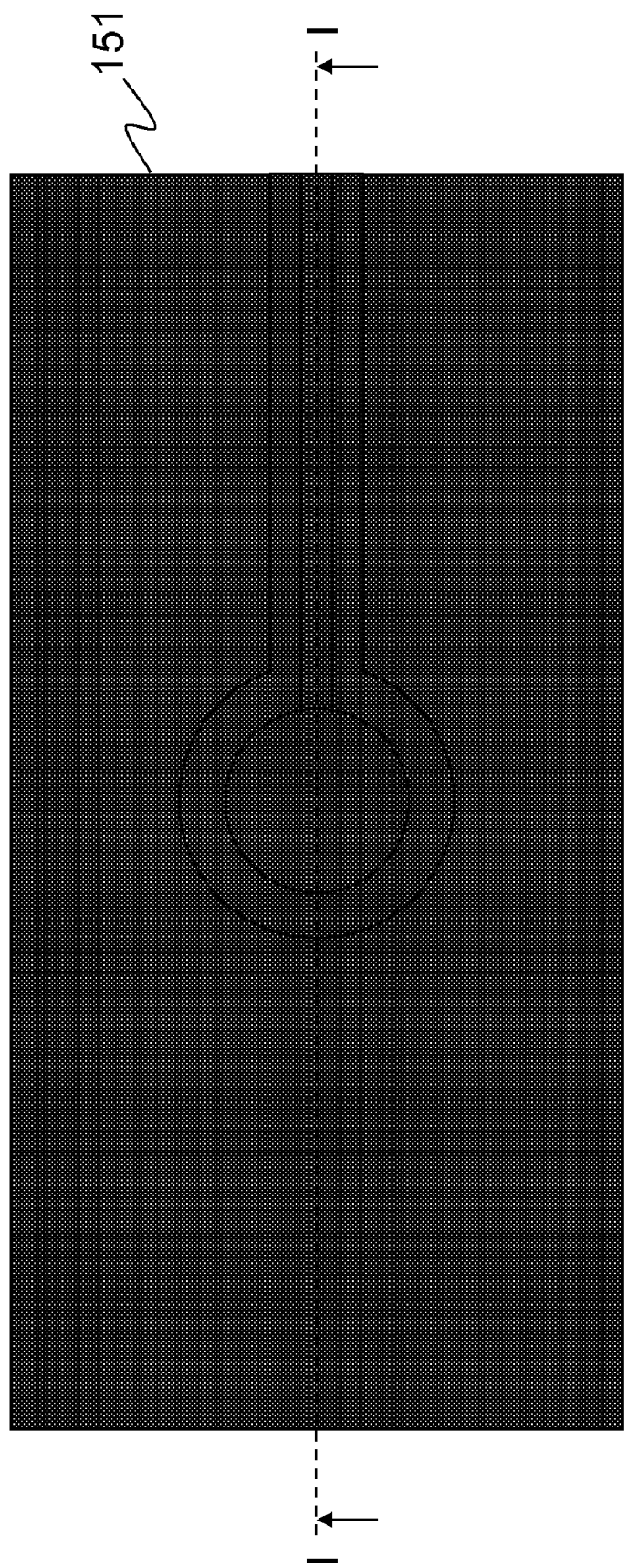

In the structure as shown FIGS. 1B and 3, in an embodiment, an insulating layer 160, for example, but not limited to $SiO_2$ layer or $SiN_2$ layer, can be first formed on the first substrate 110 in the notch 152, as shown in FIGS. 9A and 10. Then, a protective layer 142 is formed on the insulating layer 160 along the edge of the metal layer 150, as shown in FIGS. 9B and 11. Here, the protective layer 142 can substantially completely cover the insulating layer 160 between the metal layer 150 and the super lattice barrier 130. Then, a metal layer 151 is covered thereon by the metal sputtering process and other semiconductor process techniques, as shown in FIGS. 9C and 12. That is to say, the metal layer 151 is formed on the metal layer 150 and the protective layer 142, or the metal layer 151 is formed on the super lattice barrier 130, the metal layer 150, and the protective layer 142. Finally, the protective layer 142 is removed together with the metal layer 151 on the protective layer 142, so as to partition the metal layer 151 into two blocks. The block of the metal layer 151 connected to the super lattice barrier 130 is a second electrode 170. At the same time, the second electrode 170 can be spaced from the metal layer 151 of the rest block through the notch, thereby being spaced from the metal layer 150, i.e. forming the structure as shown in FIGS. 1C and 4. Here, the metal layer 150 and the metal layer 151 can be made of the same metal material, and can also be made of different metal materials. In other words, regarding the structure of FIGS. 1C and 4, the metal layer 150 can include one or more metal materials.

Figure 14:
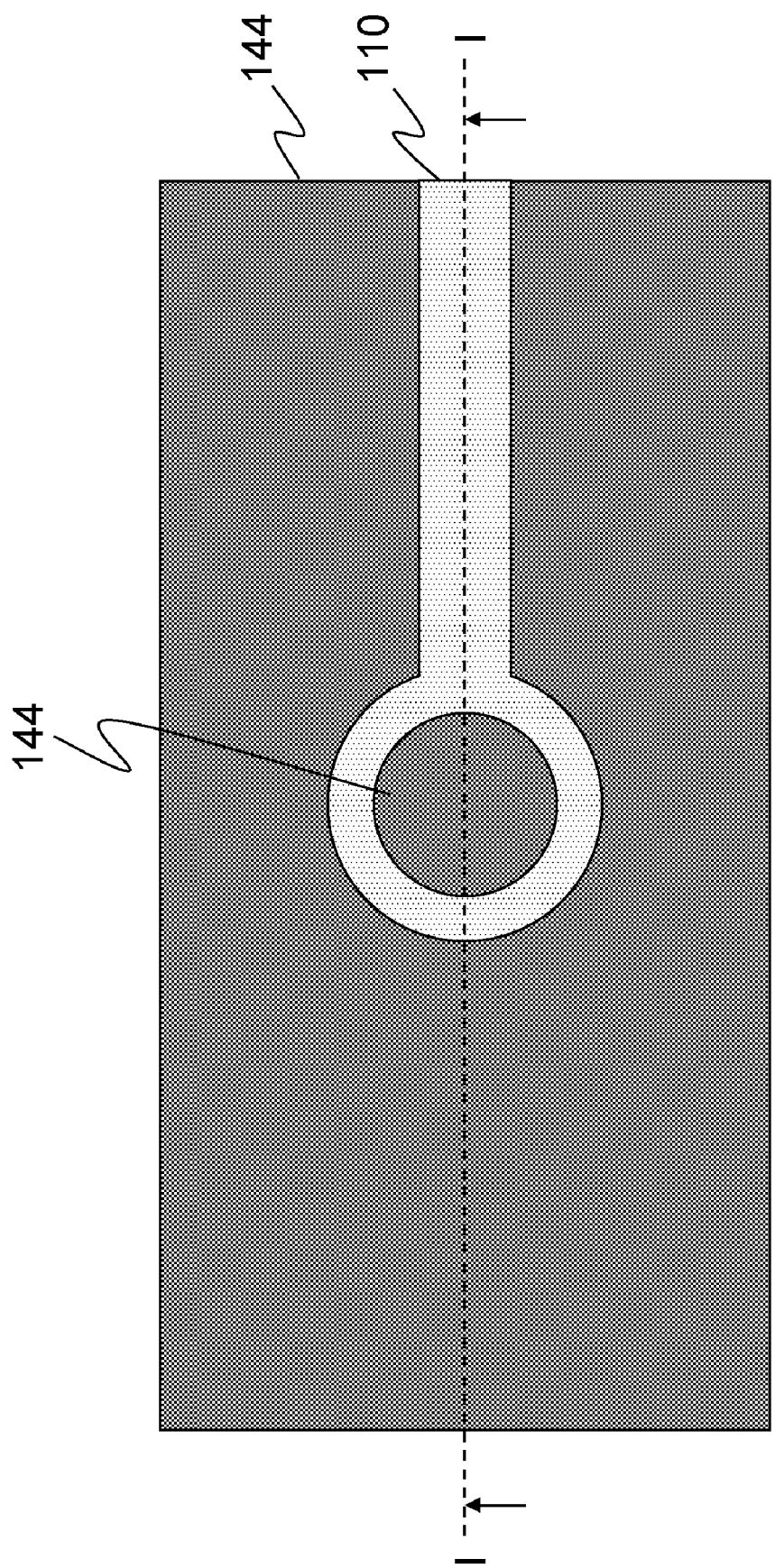

In addition, according to the structure as shown in FIGS. 1B and 3, a protective layer 144 can be coated on the metal layer 150, as shown in FIGS. 13A and 14. Here, if it intends to cover the second electrode 170 on the super lattice barrier 130, the protective layer 144 is also formed on the super lattice barrier 130. Then, the insulating layer 160 is formed on the surface of the protective layer 144 and the first substrate 110 by an overall deposition of $SiO_2$, as shown in FIG. 13B. Then, the protective layer 144 is removed together with the insulating layer 160 on the protective layer 144, so as to obtain the structure as shown in FIGS. 9A and 10.

Figure 15:
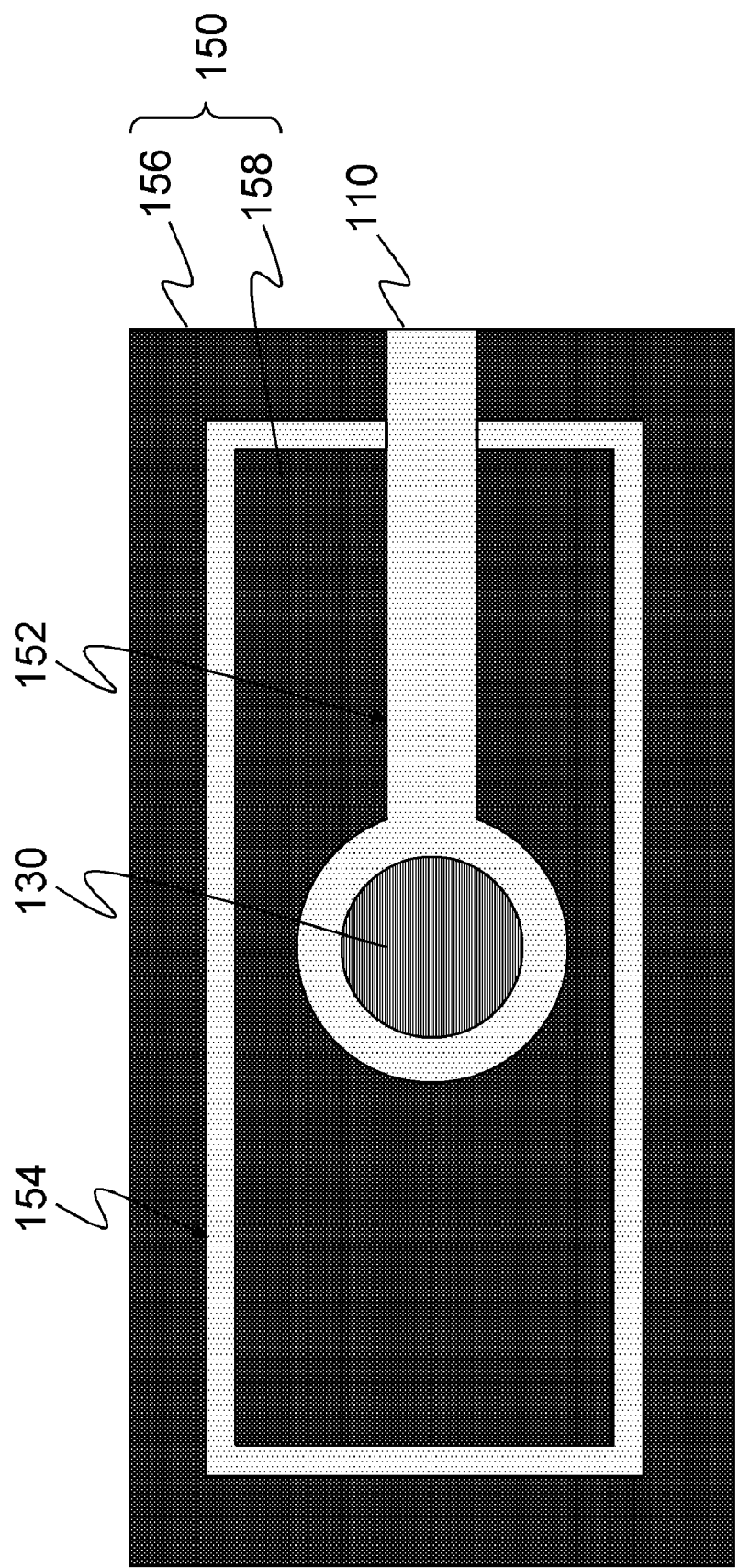
FIG. 15 is a top view of a variation of the structure as shown in FIG. 1C.

Further, a groove 154 penetrating through the metal layer 150 is formed on the metal layer 150. That is to say, the groove 154 can expose the first substrate 110, so as to partition the metal layer 150 into two blocks, as shown in FIG. 15. The block of the metal layer 150 located on the other side of the groove 154 opposite to the super lattice barrier 130 is a first electrode 156. When the device operates, the voltage required for driving the electron flow is fed from the first electrode 156. The block of the metal layer 150 on a side of the groove 154 near the super lattice barrier 130 is a heat-spreading block 158, which is used to uniformly spread the heat energy generated by the heat source on the first substrate. In other words, the heat-spreading block 158 is located between the first electrode 156 and the super lattice barrier 130, and is spaced from the first electrode 156 and the super lattice barrier 130. In addition, the groove 154 and the notch 152 can be formed in the same etching process.

Figure 16:
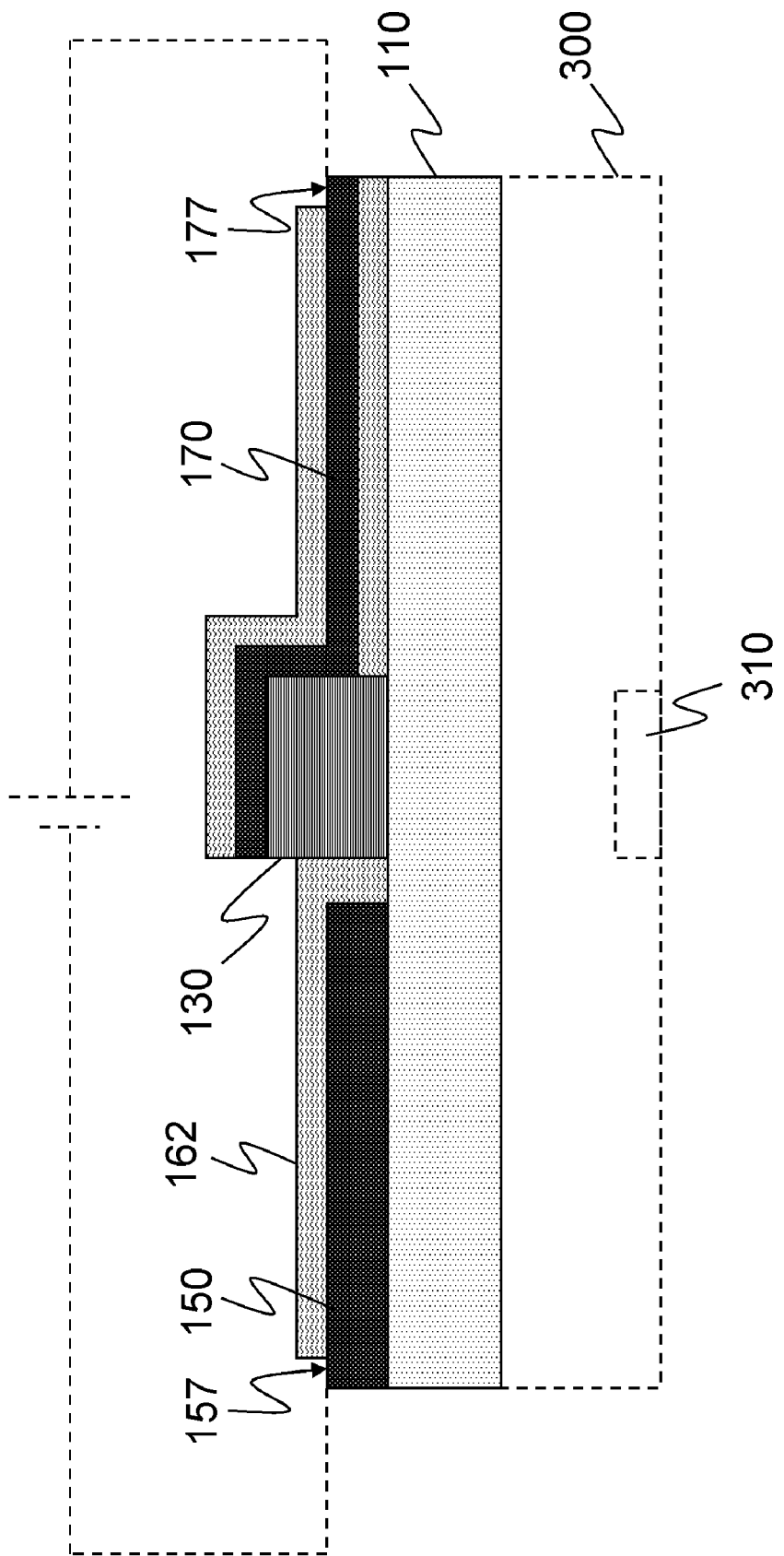
FIG. 16 is a schematic cross-sectional view of an active solid heatsink device according to a second embodiment of the present invention, in which dashed lines indicate an operation state of the device when operating.

According to the structure as shown in FIGS. 1C and 4, an insulating layer 162 can be further formed on the other surface of the metal layer 150 opposite to the first substrate 110, as shown in FIG. 16. The insulating layer 162 can be used as the substrate shared by the subsequently fabricated TE structure. Here, the insulating layer 162 can be formed by an overall coating of $SiO_2$.

Figure 17A:
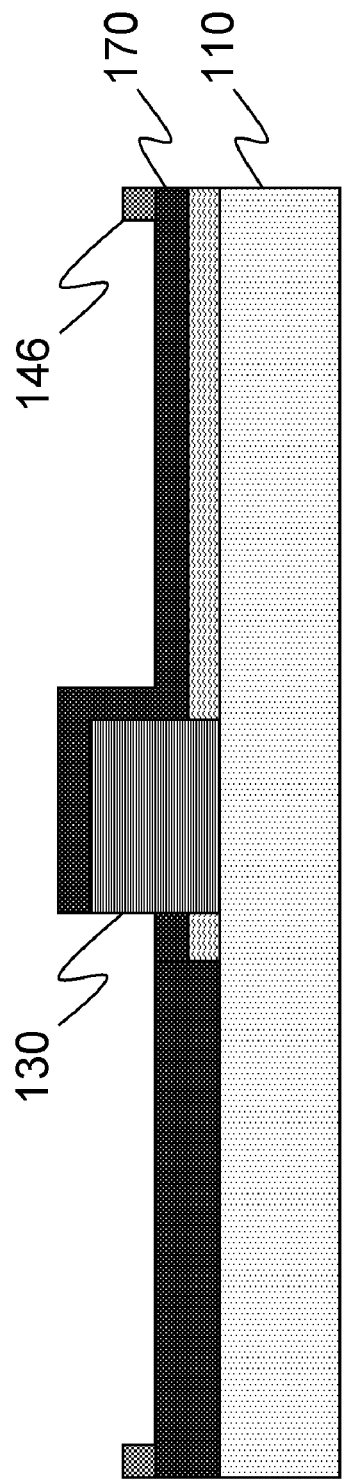
FIGS. 17A to 17B are fabrication flow charts of an embodiment of the structure as shown in FIG. 16.
Figure 17B:
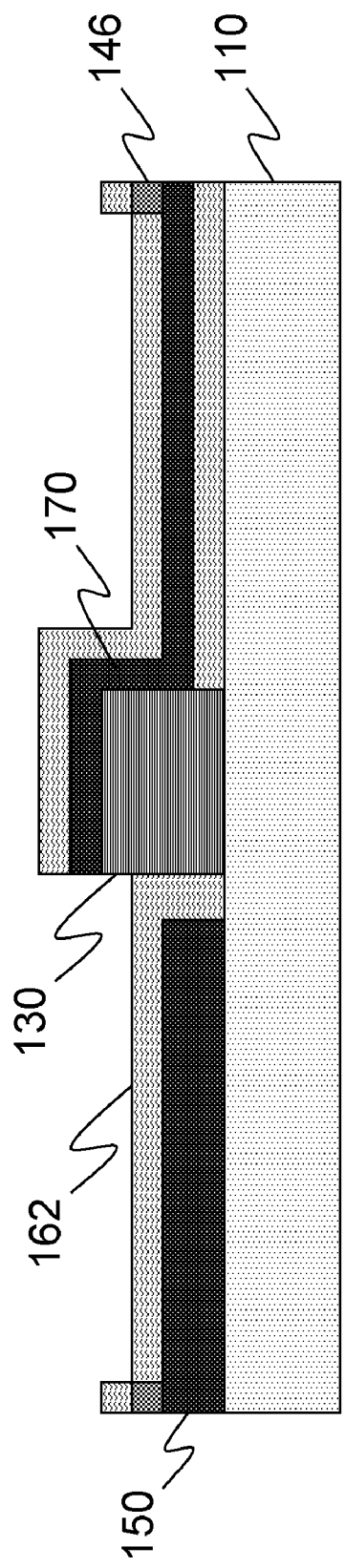

Further, a protective layer block 146 can be formed on the first electrode (i.e. the metal layer 150, and preferably the metal layer 150 away from the super lattice barrier 130) and the second electrode 170 before the insulating layer 162 is formed, as shown in FIG. 17A. Then, the insulating layer 162 is formed by an overall or partial coating of insulating material, as shown in FIG. 17B. Then, the protective layer block 146 and the insulating layer 162 thereon are removed, such that the insulating layer 162 exposes the first electrode (i.e. the metal layer 150) and the second electrode 170, as shown in FIG. 16. The part of the insulating layer 162 exposing the first electrode and the second electrode 170 can be used as voltage feeding portions 157 and 177. During operation, the other surface of the first substrate 110 opposite to the super lattice barrier 130 contacts the heat source 300, and a voltage is applied between the voltage feeding portion 157 of the first electrode and the voltage feeding portion 177 of the second electrode 170, so as to form an electron flow flowing from the second electrode 170 to the metal layer 150 through the super lattice barrier 130 and the first substrate 110, thereby carrying away the heat energy generated by the heat source 300. The heat source 300 can be a device or an element having a hot spot 310.

In addition, at least one TE structure 400 is further formed, so as to connect the insulating layer 162 and a second substrate 500, as shown in FIG. 18. In this manner, the heat spreading to the insulating layer 162 can be pumped to the second substrate 500 by the TE structure 400, so as to further improve the heat dissipation efficiency of the active solid heatsink device of the present invention. The second substrate 500 can be fabricated by, for example, silicon, ceramic, metal, or other materials. If the second substrate 500 is fabricated by the metal material, a dielectric layer is formed on the surface of the second substrate 500 and is used to isolate the electrode from the metal material of the second substrate 500. Other heatsink device modules, e.g. silicon substrate micro flow path, silicon substrate micro heat pipe, metal fin, or heat pipe, can be further integrated on the other side of the second substrate 500 opposite to the TE structure, so as to improve the heat dissipating effect.

Here, a third electrode 410 required for the subsequent assembly of the TE structure 400 can be first formed on the other surface of the insulating layer 162 opposite to the metal layer, as shown in FIG. 19.

Figure 20A:
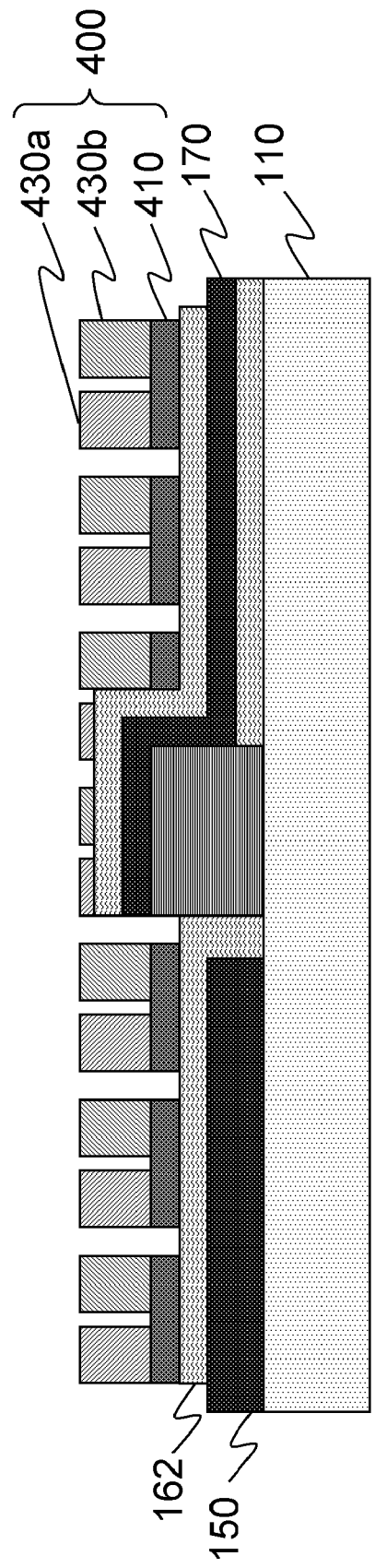
FIGS. 20A to 20B are fabrication flow charts of an embodiment of the structure as shown in FIG. 18.
Figure 20B:
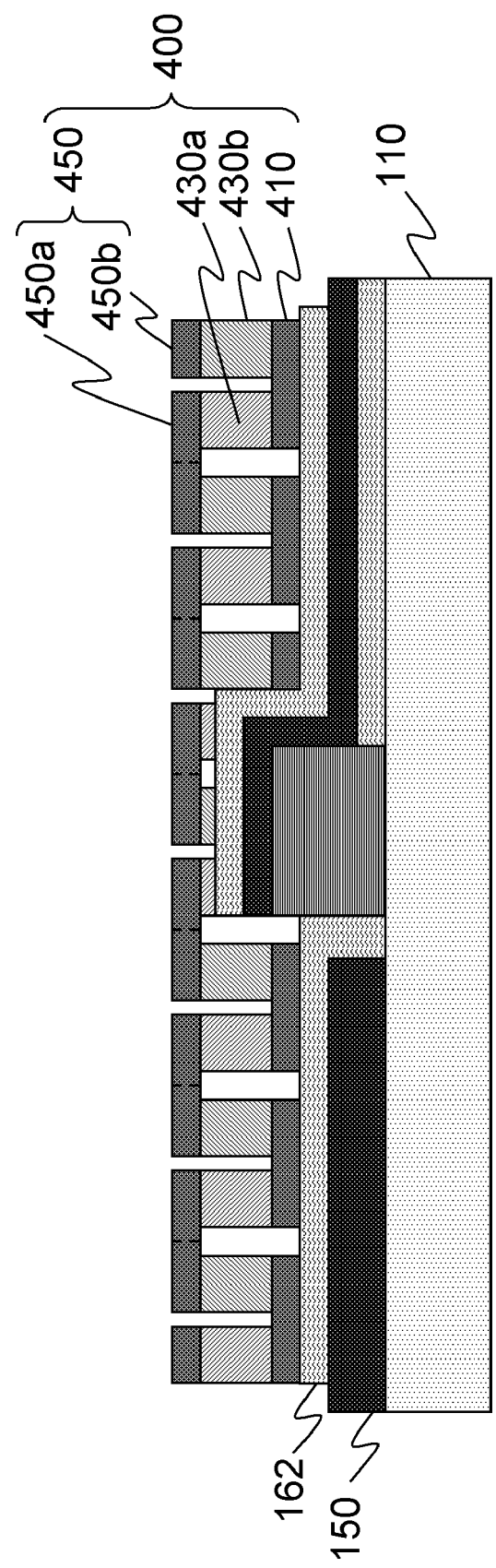

In an embodiment, according to the structure as shown in FIG. 19, a P channel 430a and an N channel 430b corresponding to each other are formed on the other surface of each third electrode 410 opposite to the insulating layer 162, as shown in FIG. 20A. A pair of fourth electrodes 450 is formed on the P channel 430a and the N channel 430b corresponding to each other, as shown in FIG. 20B. That is to say, a fourth electrode 450a of the pair of fourth electrodes 450 is formed on the other end of the P channel 430a opposite to the third electrode 410. The other fourth electrode 450b of the pair of fourth electrodes 450 is formed on the other end of the N channel 430b opposite to the third electrode 410. In this manner, the TE structure 400 can be formed by the third electrode 410, the P channel 430a and the N channel 430b corresponding to each other, and the pair of fourth electrodes 450. In other words, the P channel 430a and the N channel 430b correspond to each other, and both of the P channel 430a and the N channel 430b corresponding to each other also correspond to a third electrode 410 and a pair of fourth electrodes 450. The P channel 430a is connected between the corresponding third electrode 410 and the fourth electrode 450a of the corresponding pair of fourth electrodes 450. The N channel 430b and the corresponding P channel 430a are connected between the same third electrode 410 and the other fourth electrode 450b of the same pair of fourth electrodes 450.

Finally, the second substrate 500 is formed on the other surface of the pair of fourth electrodes 450 opposite to the P channel 430a and the N channel 430b, so as to serve as a hot end substrate of the TE structure 400.

In other words, one or more TE structures 400 can be located between the other surface of the insulating layer 162 opposite to the metal layer 150 and the second substrate 500, so as to be connected to the insulating layer 162 and the second substrate 500, and thus the structure as shown in FIG. 18 is obtained.

When the device is operated, the voltage is applied to the pair of fourth electrodes 450, such that the heat energy spreading to the insulating layer 162 is pumped to the other end of the semiconductor channel opposite to the insulating layer 162, through the carrier flowing on the semiconductor channel (i.e. the P channel 430a and the N channel 430b).

One or more TE structures 400 can be first formed on the second substrate 500, as shown in FIGS. 21A and 21B. Then, the other end of the TE structure 400 opposite to the second substrate 500 is combined with the insulating layer 162 or the third electrode 410 preformed on the insulating layer 162, and thus the structure as shown in FIG. 18 is obtained.

Figure 22A:
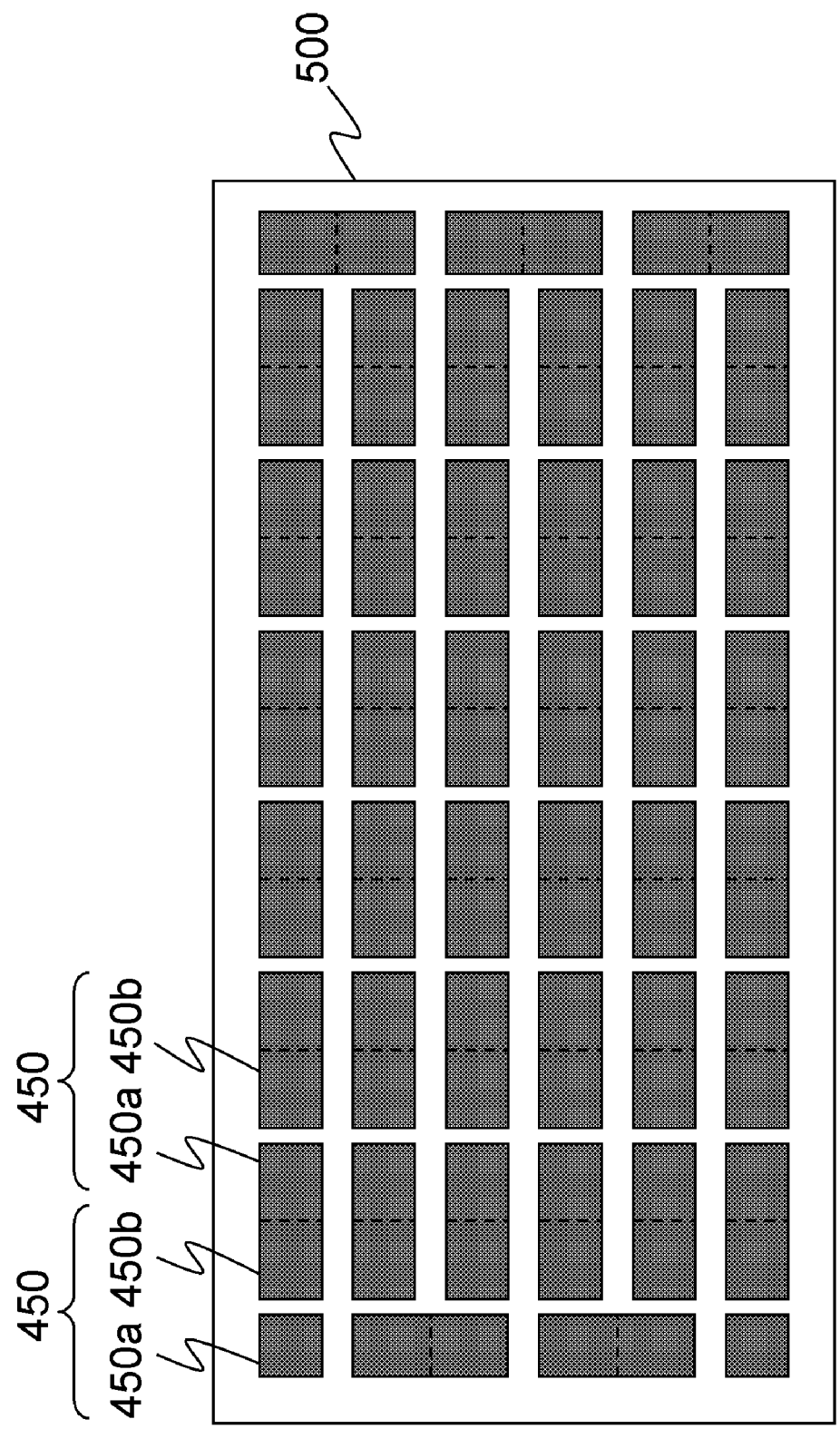
FIG. 22A is a top view of an arrangement of a first embodiment of a pair of fourth electrodes in the active solid heatsink device of the present invention.

Here, the adjacent TE structures 400 are serially connected, that is, the fourth electrodes 450a and 450b are connected together, and the fourth electrodes 450a and 450b connected to each other belong to the different pairs of fourth electrodes 450, as shown in FIG. 22A. For example, the same conductive block can be used as, but not limited to, the fourth electrodes 450a and 450b, which are adjacent and connected to each other. Or, the adjacent fourth electrodes 450a and 450b are electrically connected together by any electrical connecting components (such as, wire), and the above methods can be used at the same time. If at least two TE structures 400 are serially connected together, the fourth electrodes 450a and 450b of the adjacent different pairs of fourth electrodes 450 can be selectively connected. If all the TE structures 400 are serially connected, the fourth electrodes 450a and 450b of the adjacent different pairs of fourth electrode pair 450 can be connected together.

Figure 22B:
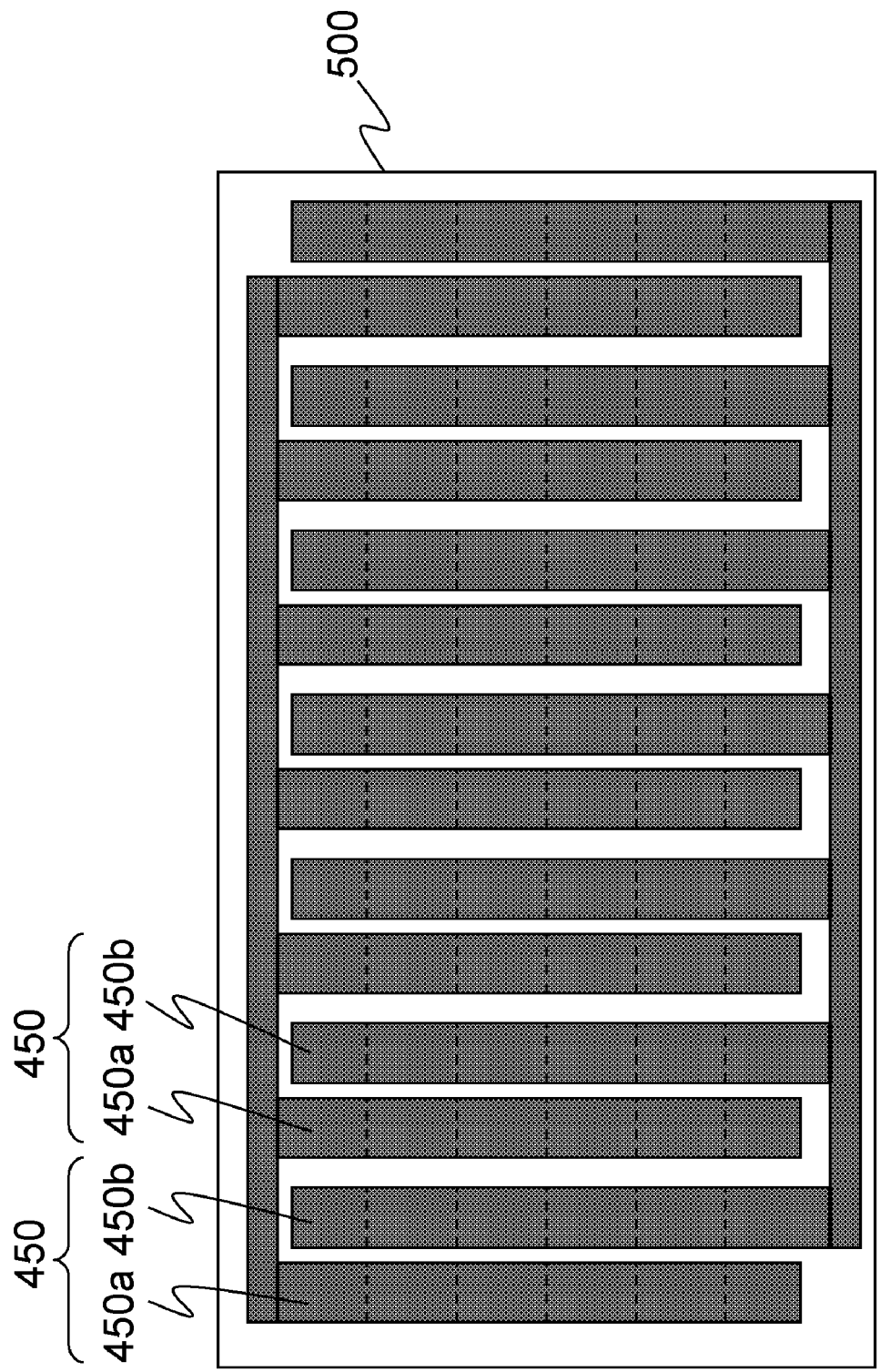
FIG. 22B is a top view of an arrangement of a second embodiment of a pair of fourth electrodes in the active solid heatsink device of the present invention.

In addition, the TE structures 400 can be connected in parallel, that is, the fourth electrodes 450a are connected together and the fourth electrodes 450b are connected together, as shown in FIG. 22B. For example, but not limited to, regarding the TE structures 400 connected in parallel, the same conductive block can be used as the fourth electrode 450a of each pair of fourth electrodes 450 (i.e. the fourth electrode 450a connected to the P channel 430a), and another conductive block is used as the fourth electrode 450b of each pair of fourth electrodes 450 (i.e. the fourth electrode 450b connected to the N channel 430b). Or, the fourth electrodes 450a connected to the P channel 430a are electrically channel 430a are electrically connected together by any electrical connecting components, and the fourth electrodes 450b connected to the N channel 430b are electrically connected together by another electrical connecting part. And, the above methods can be used at the same time. If at least two TE structures 400 are connected in parallel, the fourth electrodes 450a of the different pairs of fourth electrodes 450 are selectively connected together, and at the same time, the fourth electrodes 450b of the pairs of fourth electrodes 450 are connected together. If all the TE structures 400 are connected in parallel, the fourth electrodes 450a of all pairs of fourth electrodes 450 are connected in pairs, and the fourth electrodes 450b of all pairs of fourth electrodes 450 are connected in pairs.

Figure 23A:
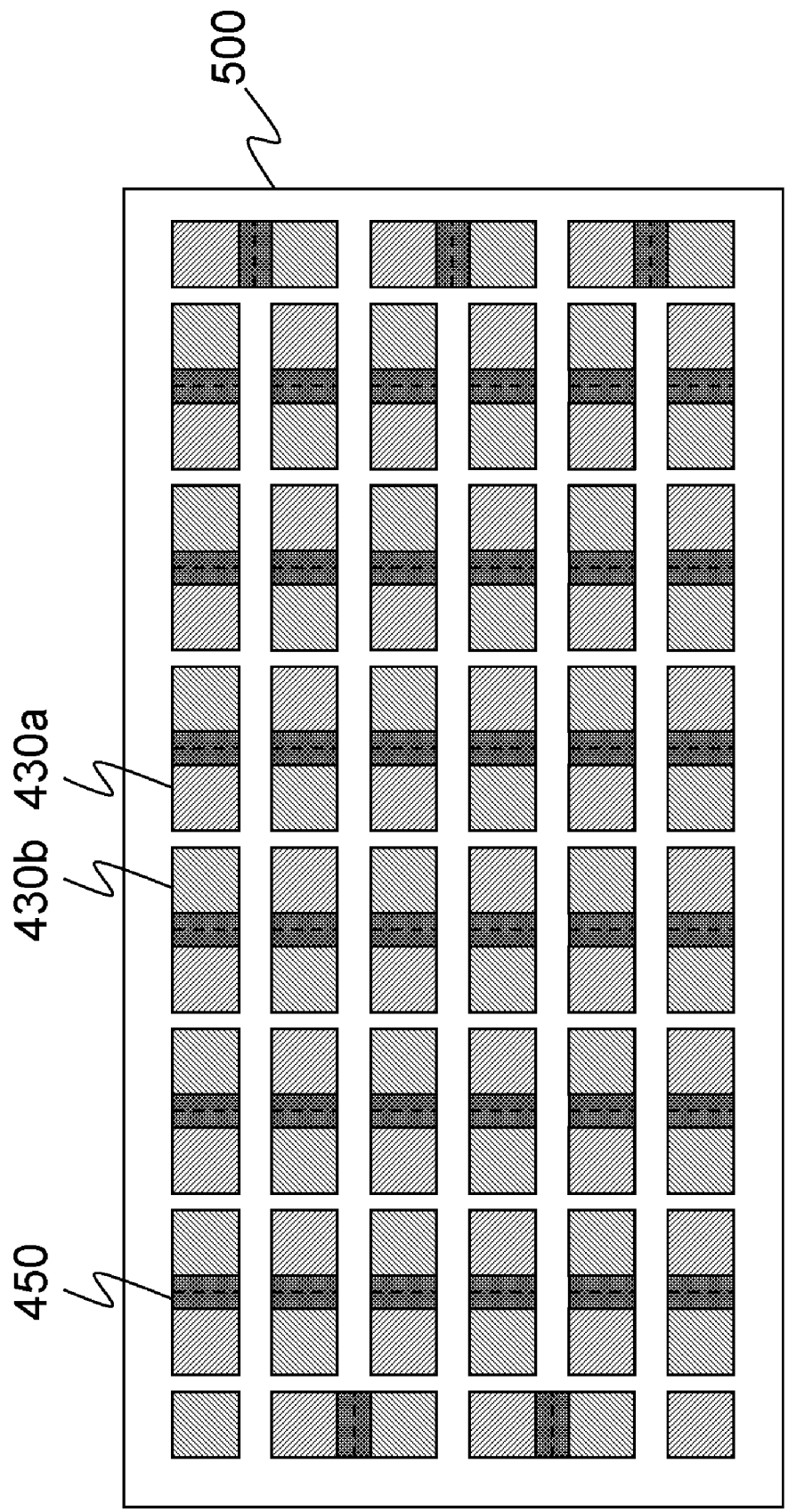
FIG. 23A is a top view of a first variation of a structure as shown in FIG. 21A.
Figure 23B:
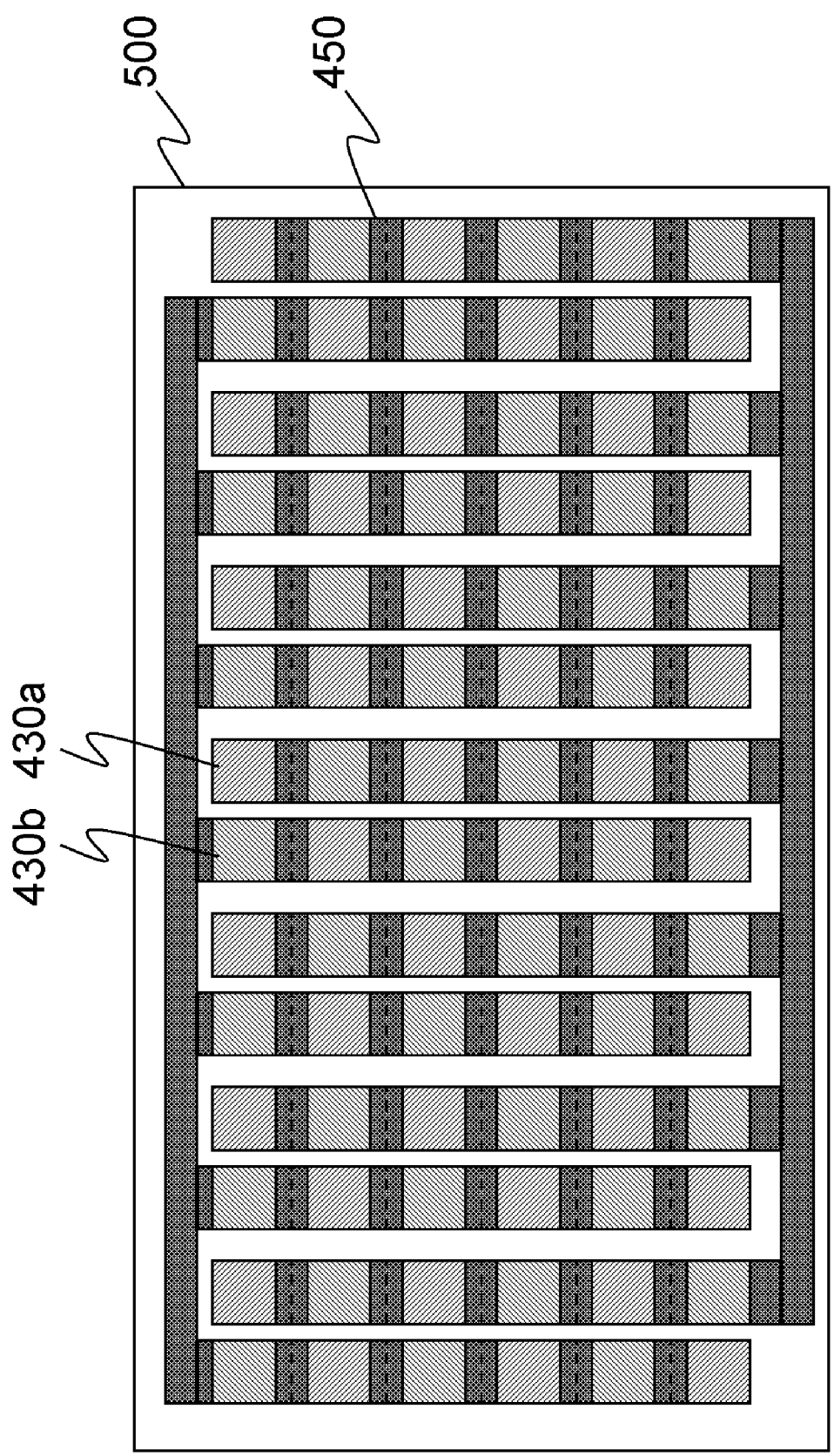
FIG. 23B is a top view of a second variation of a structure as shown in FIG. 21A.

In an embodiment, firstly the second substrate 500 can be first provided. Then, one or more pairs of fourth electrodes 450 are formed on the surface of the second substrate 500, as shown in FIGS. 22A and 22B. Then, the P channel 430a and the N channel 430b corresponding to each other are formed on the other surface of each pair of fourth electrodes 450 opposite to the second substrate 500, as shown in FIGS. 23A and 23B. Finally, the other ends of the P channel 430a and the N channel 430b opposite to the pair of fourth electrodes 450 are electrically combined with the third electrode 410 (as shown in FIG. 19) preformed on the TI structure, and thus the structure as shown in FIG. 18 is obtained. Or, the third electrode 410 (as shown in FIG. 21B) is formed on the other ends of the P channel 430a and the N channel 430b corresponding to each other opposite to the pair of fourth electrodes 450, and then the third electrode 410 is electrically combined with the other surface of the insulating layer 162 (as shown in FIG. 16) of the TI structure opposite to the metal layer 150, so as to obtain the structure as shown in FIG. 18. In other words, the cold end of the TE structure 400 contacts the insulating layer 162, and the hot end of the TE structure 400 contacts the second substrate 500.

For example, the super lattice thin layer can be grown on the surface of a heavy doped silicon wafer (i.e. the first substrate) by metal-organic chemical vapor deposition (MOCVD), molecular beam epitaxy (MBE), or other semiconductor process techniques, and then is etched by dry etching or wet etching process to form the required super lattice barrier. Then, the first electrode (e.g. the metal layer) is fabricated on the surface of the silicon wafer (i.e. the surface of the substrate having the super lattice barrier). The metal electrode (i.e. the first electrode) includes a seed layer, which is contributive to attach the metal electrode to the surface of the silicon wafer. Then, an insulating layer is grown on the surface of the silicon wafer. Finally, the second electrode required by the super lattice barrier is fabricated on the insulating layer, and then an insulating layer is grown, so as to form the TI structure. Here, the insulating layer can be used as the substrate shared by the TI structure and the TE structure. Here, the electrode required by the TE structure can be first fabricated on the insulating layer, for the subsequent assembly of the TE structure. The TI structure is formed on a surface of the first substrate in an approximately transverse arrangement manner (along the surface of the substrate), and then the other surface of the first substrate contacts the heat source. When the TI structure operates, the electron flow moving along the surface of the first substrate can be generated, so as to transversely carrying away the heat generated by the heat source.

To sum up, the active solid heatsink device and the fabricating method thereof of the present invention are directed to provide a high-effective solid cooling device. Here, the heat conduction characteristics of the hot electrons of the TI structure is used for spreading the heat generated by the heat source with the small area and the high heat-generating density (for example, but it is not limited here, spot heat source on the IC, laser diode, LED, or other heat sources) to the whole substrate. The TI structure and the TE structure share the substrate where the heat spreads to. Moreover, the shared substrate is used as the cold end of the TE structure, and then the TE structure is used to pump the heat spreading to the shared substrate to another substrate of the TE structure as the hot end of the TE structure. In other words, on the structure, the TI structure and the cold end of the TE structure can be integrated by the semiconductor process, the micro-electromechanical process, the semiconductor packaging process, and other processes. The TI structure and the TE structure can be disposed on the same side of the heat source, so as to be widely applied to dissipate heat of various heat source devices. On the operation of the device, the active heat-spreading is first performed on the heat source with the small area and the high heat-generating density by the TI structure, such that the heat of the heat source is uniformly distributed on the cold end substrate of the TE structure, so as to reduce the local high temperature resulting from the heat concentration at the heat source. Then, the TE structure is used to force the transmission of the heat energy spreading on the shared substrate (cold end) to the substrate (hot end) of the other end of the TE structure in the electron and hole heat conduction manner, so as to cool the heat source. In this manner, the active solid heatsink device and the fabricating method according to the present invention can overcome the problem of low performance resulting from the over high pin load of the conventional TE element caused by the pin area larger than the heat source area with a high heat-generating density. At the same time, the active solid heatsink device and the fabricating method thereof of the present invention can greatly improve the heat dissipation efficiency, and meanwhile reduce the heat energy generated by a non-hot spot area of the application device/element (such as IC), thereby achieving a double enhanced cooling effect.

According to the active solid heatsink device and the fabricating method thereof of the present invention, the high-effective solid cooling device provided by the present invention has a wide application field, and can be used for cooling not only the common ICs and LEDs, but also a laser source, a switcher, a router, a detector, and other elements in a large scale integrated circuit (LSI), a processor, or an optical communication system, and even a refrigerator and other household appliance.

What is claimed is:

1. An active solid heatsink device, comprising:
   a first substrate, being heavy doped;
   a metal layer, located on the first substrate, and having a first electrode and a heat-spreading block;
   a semiconductor film block, located on the first substrate on which the metal layer is located, and spaced from the metal layer, the heat-spreading block being located between the first electrode and the semiconductor film block, and being spaced from the first electrode and the semiconductor film block; and
   a second electrode, connected to the semiconductor film block, and spaced from the metal layer and the first substrate.

2. An active solid heatsink device, comprising:
   a first substrate, being heavy doped;
   a metal layer, located on the first substrate, and having a first electrode;
   an insulating layer, covered on the metal layer opposite to the first substrate;
   a second substrate;
   one or more thermo-electric (TE) structures, located between the insulating layer and the second substrate, and connected to the insulating layer and the second substrate;
   a semiconductor film block, located on the first substrate on which the metal layer is located, and spaced from the metal layer; and
   a second electrode, connected to the semiconductor film block, and spaced from the metal layer and the first substrate.

3. The active solid heatsink device according to claim 2, wherein each of the TE structures comprises:
   a third electrode, located on the insulating layer opposite to the metal layer, and electrically isolating the first electrode and the second electrode by the insulating layer;
   a pair of fourth electrodes, located on the second substrate;
   a P channel, one end of which is connected to the third electrode, and the other end of which is connected to one of the pair of fourth electrodes opposite to the second substrate; and
   an N channel, one end of which is connected to the third electrode, and the other end of which is connected to the other one of the pair of fourth electrodes opposite to the second substrate.

4. The active solid heatsink device according to claim 3, wherein the adjacent two of the fourth electrodes are connected to each other, and the fourth electrodes connected to each other individually belong to the different pairs of fourth electrodes.

5. The active solid heatsink device according to claim 3, wherein the fourth electrodes in contact with the N channel are connected to each other, and the fourth electrodes in contact with the P channel are connected to each other.

6. The active solid heatsink device according to claim 2, wherein at least two of the TE structures are serially connected to each other.

7. The active solid heatsink device according to claim 2, wherein at least two of the TE structures are connected in parallel to each other.

8. An active solid heatsink device, comprising:
   a first substrate, being heavy doped;
   a metal layer, located on the first substrate, and having a first electrode;

an insulating layer, covered on the metal layer opposite to the first substrate;

a semiconductor film block, located on the first substrate on which the metal layer is located, and spaced from the metal layer; and a second electrode, connected to the semiconductor film block, and spaced from the metal layer and the first substrate, each of the first electrode and the second electrode having a voltage feeding portion, and the insulating layer exposing the voltage feeding portions.

9. An active solid heatsink device, comprising:

a first substrate, being heavy doped;

a metal layer, located on the first substrate, and having a first electrode;

an insulating layer, covered on the metal layer opposite to the first substrate;

a semiconductor film block, located on the first substrate on which the metal layer is located, and spaced from the metal layer;

a second electrode, connected to the semiconductor film block, and spaced from the metal layer and the first substrate; and one or more third electrodes, located on the insulating layer opposite to the metal layer, and electrically isolating the first electrode and the second electrode by the insulating layer.

10. The active solid heatsink device according to claim 9, further comprising:

one or more pairs of fourth electrodes;

one or more P channels, each of which corresponds to one of the third electrodes and one pair of the pairs of fourth electrodes, and is connected between the corresponding third electrode and one of the corresponding pair of fourth electrodes; and one or more N channels, respectively corresponding to the P channels, each of the N channels being connected between the third electrode connected to the corresponding P channel and the other one of the pair of fourth electrodes being connected to the corresponding P channel.

11. The active solid heatsink device according to claim 10, wherein the adjacent two of the fourth electrodes are connected to each other, and the fourth electrodes connected to each other belonging to the different pairs of fourth electrodes.

12. The active solid heatsink device according to claim 10, wherein the fourth electrodes in contact with the N channels are connected to each other, and the fourth electrodes in contact with the P channels are connected to each other.

13. The active solid heatsink device according to claim 9, further comprising:

a second substrate, located on the pairs of fourth electrodes opposite to the P channels and the N channels.

14. An active solid heatsink device, comprising:

a first substrate, being heavy doped;

a metal layer, located on the first substrate, and having a first electrode and a notch;

a semiconductor film block, located on the first substrate on which the metal layer is located, and spaced from the metal layer, the notch extending from the semiconductor film block to far away to expose the first substrate; and a second electrode, connected to the semiconductor film block, spaced from the metal layer and the first substrate and located above the notch.

15. A method of fabricating an active solid heatsink device, comprising:

providing a first substrate with heavy doped;

forming a semiconductor film block and a metal layer on the same surface of the first substrate, wherein the semiconductor film block and the metal layer are spaced apart, and the metal layer has a first electrode;

forming a second electrode connected to the semiconductor film and spaced from the metal layer and the first substrate;

forming an insulating layer for covering the metal layer;

forming one or more thermo-electric (TE) structures on the insulating layer opposite to the metal layer, wherein the TE structures are electrically isolated from the first electrode and the second electrode by the insulating layer; and forming a second substrate on the TE structures, wherein a cold end of each of the TE structures contacts with the insulating layer, and a hot end of each of the TE structures contacts with the second substrate.

16. The method of fabricating an active solid heatsink device according to claim 15, wherein the step of forming the TE structures comprises:

forming one or more third electrodes on the insulating layer opposite to the metal layer;

forming a P channel and an N channel on each of the third electrodes opposite to the insulating layer; and respectively forming a pair of fourth electrodes on both of the P channel and the N channel which contact with the same third electrode opposite to the third electrode, wherein the surfaces of the pairs of fourth electrodes opposite to the P channels and the N channels are configured to contact with the second substrate.

17. The method of fabricating an active solid heatsink device according to claim 16, wherein in the step of forming the pairs of fourth electrodes, the adjacent two of the fourth electrodes are connected to each other, and the fourth electrodes connected to each other individually belong to the different pairs of fourth electrodes.

18. The method of fabricating an active solid heatsink device according to claim 16, wherein in the step of forming the pairs of fourth electrodes, the fourth electrodes in contact with the N channels are connected to each other, and the fourth electrodes in contact with the P channels are connected to each other.

19. A method of fabricating an active solid heatsink device, comprising:

providing a first substrate with heavy doped;

forming a semiconductor film block and a metal layer on the same surface of the first substrate, wherein the semiconductor film block and the metal layer are spaced apart, and the metal layer has a first electrode;

forming a second electrode connected to the semiconductor film block and spaced from the metal layer and the first substrate;

forming an insulating layer for covering the metal layer;

providing a second substrate;

forming one or more TE structures each with a cold end and a hot end, which are opposite to each other, on the second substrate, wherein the hot end of each of the TE structures contacts with the second substrate; and connecting the TE structures with the insulating layer opposite to the metal layer, wherein the cold end of each of the TE structures contacts with the insulating layer.

20. The method of fabricating an active solid heatsink device according to claim 19, wherein the step of forming the TE structures comprises:

forming one or more pairs of fourth electrodes on the second substrate;
forming a P channel on one fourth electrode of each pair of the pairs of fourth electrodes opposite to the second substrate;
forming an N channel on the other one fourth electrode of each pair of the pairs of fourth electrodes opposite to the second substrate; and
respectively forming a third electrode on both of the P channel and the N channel, which are connected to the same pair of fourth electrodes, opposite to the pair of fourth electrodes, wherein the other side of the third electrode opposite to the P channel and the N channel is used to contact the insulating layer.

21. The method of fabricating an active solid heatsink device according to claim 20, wherein in the step of forming the pairs of fourth electrodes, the adjacent two of the fourth electrodes are connected to each other, and the fourth electrodes connected to each other individually belong to the different pairs of fourth electrodes.

22. The method of fabricating an active solid heatsink device according to claim 20, wherein in the step of forming the pairs of the fourth electrodes, the fourth electrodes in contact with the N channels are connected to each other, and the fourth electrodes in contact with the P channels are connected to each other.

23. A method of fabricating an active solid heatsink device, comprising:
providing a first substrate with heavy doped;
forming a semiconductor film block and a metal layer on the same surface of the first substrate, wherein the semiconductor film block and the metal layer are spaced apart, and the metal layer has a first electrode;
forming a second electrode connected to the semiconductor film and spaced from the metal layer and the first substrate; and
forming the insulating layer for covering the metal layer and the second electrode and for exposing the first electrode and the second electrode, wherein the parts of the first electrode and the second electrode exposed by the insulating layer is configured to apply voltage.

24. A method of fabricating an active solid heatsink device, comprising:
providing a first substrate with heavy doped;
forming a semiconductor film block and a metal layer on the same surface of the first substrate, wherein the semiconductor film block and the metal layer are spaced apart, and the metal layer has a first electrode, the step of forming the semiconductor film block and the metal layer comprising:
forming the metal layer spaced from the semiconductor film block on the first substrate; and
forming a groove that exposes the first substrate on the metal layer for partitioning the metal layer into two blocks, wherein the block of the metal layer located on the other side of the groove opposite to the semiconductor film block is the first electrode; and
forming a second electrode connected to the semiconductor film and spaced from the metal layer and the first substrate.

25. A method of fabricating an active solid heatsink device, comprising:
providing a first substrate with heavy doped;
forming a semiconductor film block and a metal layer on the same surface of the first substrate, wherein the semiconductor film block and the metal layer are spaced apart, and the metal layer has a first electrode and a notch on the first substrate, and the semiconductor film block is located in the notch and spaced from the metal layer by the notch; and
forming a second electrode connected to the semiconductor film and spaced from the metal layer and the first substrate.

26. The method of fabricating an active solid heatsink device according to claim 25, wherein the step of forming the metal layer having the notch comprises:
forming the metal layer having the notch extending from the position of the corresponding semiconductor film block to far away on the first substrate.

27. The method of fabricating an active solid heatsink device according to claim 26 wherein the step of forming the second electrode comprises:
forming an insulating layer on the first substrate in the notch; and
forming the second electrode connected to the semiconductor film block and spaced from the metal layer on the insulating layer at a position corresponding to the notch.

28. A method of fabricating an active solid heatsink device, comprising:
providing a first substrate with heavy doped;
forming a semiconductor film block and a metal layer on the same surface of the first substrate, wherein the semiconductor film block and the metal layer are spaced apart, and the metal layer has a first electrode;
forming a second electrode connected to the semiconductor film and spaced from the metal layer and the first substrate;
forming an insulating layer for covering the metal layer; and
forming at least one third electrode on the other surface of the insulating layer opposite to the metal layer.

29. The method of fabricating an active solid heatsink device according to claim 28, further comprising:
fabricating a TE structure on the other surface of each third electrode opposite to the insulating layer.

* * * * *